(12) United States Patent
Nakazawa et al.

(10) Patent No.: US 10,609,244 B2
(45) Date of Patent: Mar. 31, 2020

(54) PHOTOELECTRIC CONVERSION ELEMENT AND IMAGE PROCESSING APPARATUS

(71) Applicants: Masamoto Nakazawa, Kanagawa (JP); Yuuya Miyoshi, Osaka (JP); Atsushi Suzuki, Kumamoto (JP)

(72) Inventors: Masamoto Nakazawa, Kanagawa (JP); Yuuya Miyoshi, Osaka (JP); Atsushi Suzuki, Kumamoto (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/269,592

(22) Filed: Feb. 7, 2019

(65) Prior Publication Data

US 2019/0268496 A1 Aug. 29, 2019

(30) Foreign Application Priority Data

Feb. 23, 2018 (JP) ................. 2018-031219

(51) Int. Cl.
*H01L 27/146* (2006.01)
*H04N 5/3745* (2011.01)
(Continued)

(52) U.S. Cl.
CPC ......... *H04N 1/0308* (2013.01); *H01L 27/146* (2013.01); *H01L 27/14603* (2013.01);
(Continued)

(58) Field of Classification Search
CPC .... H04N 5/37457; H04N 5/378; H04N 9/045; H04N 5/2254; H04N 5/355; H04N 9/07; H04N 5/35563; H04N 5/3745; H04N 5/2176; H04N 5/335; H04N 5/35554; H04N 5/3658; H04N 5/3698; H04N 5/37452;
(Continued)

(56) References Cited

U.S. PATENT DOCUMENTS 4,972,157 A * 11/1990 Moyal ..................... H03F 1/303
327/408
5,132,762 A * 7/1992 Yamada ............ H01L 27/14831
257/440
(Continued)

FOREIGN PATENT DOCUMENTS

JP 2017-005427 1/2017

OTHER PUBLICATIONS

U.S. Appl. No. 16/135,578, filed Sep. 19, 2018, Daisuke Nikaku, et al.
(Continued)

*Primary Examiner* — Negussie Worku
(74) *Attorney, Agent, or Firm* — Oblon, McClelland, Maier & Neustadt, L.L.P.

(57) ABSTRACT

A photoelectric conversion element includes a plurality of pixels to receive light; and a signal processor to process a signal of the pixels. The signal processor includes: a first element, being a transistor, having a first effective channel width through which a current can effectively pass through in the first element; and a second element, being a transistor, having a second effective channel width through which a current can effectively pass through in the second element. The first effective channel width of the first element is larger than the second effective channel width of the second element.

17 Claims, 21 Drawing Sheets

(51) Int. Cl.
*H04N 5/00* (2011.01)
*H04N 1/03* (2006.01)
*H04N 5/363* (2011.01)
*H04N 5/369* (2011.01)
*H04N 5/365* (2011.01)

(52) U.S. Cl.
CPC ......... *H01L 27/14616* (2013.01); *H04N 5/00* (2013.01); *H04N 5/363* (2013.01); *H04N 5/365* (2013.01); *H04N 5/3692* (2013.01); *H04N 5/37457* (2013.01); *H01L 27/14645* (2013.01)

(58) Field of Classification Search
CPC ...... H04N 5/379; H04N 5/341; H04N 5/3456; H04N 5/347; H04N 5/3559; H04N 5/3575; H04N 5/361; H04N 5/365; H04N 5/374; H04N 5/3742; H04N 5/37455; H04N 9/04511; G01J 3/04; G01J 3/1804; G01J 3/2803; G01J 3/2823; G01J 3/502; G01J 3/51; G01J 3/513; H01L 27/14623; H01L 27/14625; H01L 27/14645; H01L 27/14687; H01L 27/14689; H01L 27/14831; H01L 27/14643; H01L 27/307; H01L 27/14621; H01L 27/14627; H01L 27/14636; H01L 27/1464
USPC ........................................................ 358/474
See application file for complete search history.

(56) References Cited

U.S. PATENT DOCUMENTS

| | | | | |
|---|---|---|---|---|
| 5,446,297 | A * | 8/1995 | Lee | H01L 27/14887 257/223 |
| 5,504,355 | A * | 4/1996 | Hatano | H01L 31/02164 257/225 |
| 6,268,234 | B1 * | 7/2001 | Yoshida | H01L 27/14812 257/E27.152 |
| 8,258,512 | B2 * | 9/2012 | Nishi | H01L 27/14634 257/59 |
| 2001/0015221 | A1 * | 8/2001 | Kubota | H01L 31/048 136/256 |
| 2007/0188638 | A1 | 8/2007 | Nakazawa et al. | |
| 2008/0252787 | A1 | 10/2008 | Nakazawa et al. | |
| 2009/0190017 | A1 | 7/2009 | Ono | |
| 2010/0027061 | A1 | 2/2010 | Nakazawa | |
| 2010/0091167 | A1 * | 4/2010 | Azami | H03F 3/08 348/340 |
| 2010/0171998 | A1 | 7/2010 | Nakazawa | |
| 2010/0231761 | A1 | 9/2010 | Yanai | |
| 2011/0026083 | A1 | 2/2011 | Nakazawa | |
| 2011/0051201 | A1 | 3/2011 | Hashimoto et al. | |
| 2011/0063488 | A1 | 3/2011 | Nakazawa | |
| 2012/0025280 | A1 * | 2/2012 | Narui | H01L 27/14614 257/292 |
| 2012/0092732 | A1 * | 4/2012 | Nakazawa | H04N 1/00928 358/474 |
| 2012/0224205 | A1 | 9/2012 | Nakazawa | |
| 2013/0063792 | A1 | 3/2013 | Nakazawa | |
| 2013/0162870 | A1 | 6/2013 | Miyoshi et al. | |
| 2014/0029065 | A1 | 1/2014 | Nakazawa | |
| 2014/0204427 | A1 | 7/2014 | Nakazawa | |
| 2014/0204432 | A1 | 7/2014 | Hashimoto et al. | |
| 2014/0211273 | A1 | 7/2014 | Konno et al. | |
| 2014/0368893 | A1 | 12/2014 | Nakazawa et al. | |
| 2015/0021460 | A1 * | 1/2015 | Matsuda | H04N 9/045 250/208.1 |
| 2015/0098117 | A1 | 4/2015 | Marumoto et al. | |
| 2015/0116794 | A1 | 4/2015 | Nakazawa | |
| 2015/0163378 | A1 | 6/2015 | Konno et al. | |
| 2015/0222790 | A1 | 8/2015 | Asaba et al. | |
| 2015/0304517 | A1 | 10/2015 | Nakazawa et al. | |
| 2016/0003673 | A1 | 1/2016 | Hashimoto et al. | |
| 2016/0006961 | A1 | 1/2016 | Asaba et al. | |
| 2016/0064444 | A1 * | 3/2016 | Inoue | H01L 29/7869 257/43 |
| 2016/0088179 | A1 | 3/2016 | Nakazawa et al. | |
| 2016/0112660 | A1 | 4/2016 | Nakazawa et al. | |
| 2016/0119495 | A1 | 4/2016 | Konno et al. | |
| 2016/0119562 | A1 * | 4/2016 | Takase | H04N 5/353 348/230.1 |
| 2016/0134789 | A1 * | 5/2016 | Inoue | H04N 5/2253 348/374 |
| 2016/0173719 | A1 | 6/2016 | Hashimoto et al. | |
| 2016/0268330 | A1 | 9/2016 | Nakazawa et al. | |
| 2016/0295138 | A1 | 10/2016 | Asaba et al. | |
| 2016/0358958 | A1 | 12/2016 | Miyoshi et al. | |
| 2016/0373604 | A1 | 12/2016 | Hashimoto et al. | |
| 2017/0019567 | A1 | 1/2017 | Konno et al. | |
| 2017/0064233 | A1 * | 3/2017 | Matsumoto | H04N 5/357 |
| 2017/0163836 | A1 | 6/2017 | Nakazawa | |
| 2017/0170225 | A1 | 6/2017 | Asaba et al. | |
| 2017/0171483 | A1 | 6/2017 | Kudoh et al. | |
| 2017/0201700 | A1 | 7/2017 | Hashimoto et al. | |
| 2017/0244844 | A1 | 8/2017 | Miyoshi et al. | |
| 2017/0264844 | A1 | 9/2017 | Kamezawa et al. | |
| 2017/0272742 | A1 | 9/2017 | Suzuki et al. | |
| 2017/0295298 | A1 | 10/2017 | Ozaki et al. | |
| 2017/0302821 | A1 | 10/2017 | Sasa et al. | |
| 2017/0324883 | A1 | 11/2017 | Konno et al. | |
| 2018/0124334 | A1 * | 5/2018 | Li | H04N 5/235 |
| 2018/0146150 | A1 | 5/2018 | Shirado et al. | |
| 2018/0175096 | A1 | 6/2018 | Inoue et al. | |
| 2018/0213124 | A1 * | 7/2018 | Yokohama | H04N 1/401 |
| 2018/0249107 | A1 | 8/2018 | Kamezawa et al. | |
| 2018/0261642 | A1 | 9/2018 | Asaba et al. | |
| 2018/0269242 | A1 * | 9/2018 | Kawahito | H01L 27/1461 |
| 2018/0367749 | A1 | 12/2018 | Miyoshi et al. | |
| 2019/0035261 | A1 * | 1/2019 | Selfe | G08C 17/02 |

OTHER PUBLICATIONS

U.S. Appl. No. 16/029,946, filed Jul. 9, 2018, Yuuya Miyoshi, et al.
Extended European Search Report dated Mar. 29, 2019 in Patent Application No. 19152855.3 citing documents AA-AB therein, 7 pages.

* cited by examiner

FIG. 10A
FIG. 10B
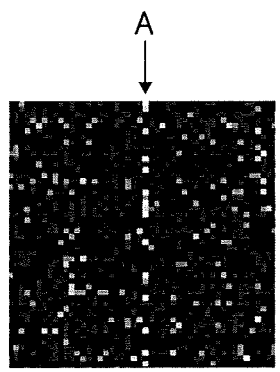
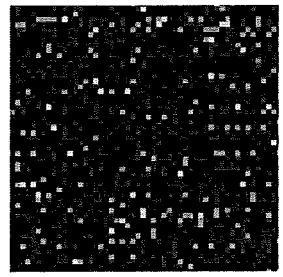
FIG. 11A
FIG. 11B
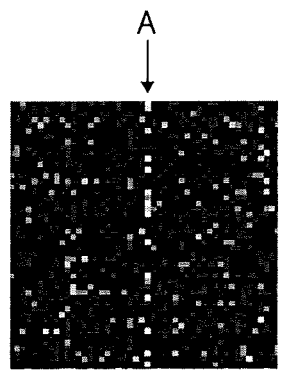
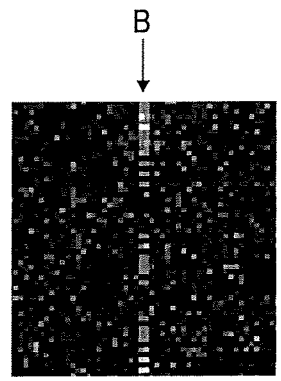

PHOTOELECTRIC CONVERSION ELEMENT AND IMAGE PROCESSING APPARATUS

CROSS-REFERENCE TO RELATED APPLICATIONS

This patent application is based on and claims priority pursuant to 35 U.S.C. § 119(a) to Japanese Patent Application No. 2018-031219, filed on Feb. 23, 2018, in the Japan Patent Office, the entire disclosure of which is hereby incorporated by reference herein.

BACKGROUND

Technical Field

The present invention relates to a photoelectric conversion element and an image processing apparatus.

Description of the Related Art

Usually, a crystal defect is present in a silicon wafer, and when the crystal defect is present in a channel layer of a transistor, electrons are captured (trapped)/emitted in the crystal defect and appear as a 1/f noise. Although this noise is considered to be one kind of the 1/f noise, the noise is called random telegraph noise (RTN) because of being generated randomly. The RTN is a noise that has been apparent by miniaturization of transistors by manufacturing processes in recent years, and in linear image sensors, an impact thereof appears as a vertical streak, which is fatal on an image.

For example, JP2017-005427A discloses an amplification transistor of a pixel, which is smaller than a size of an amplification transistor configured for every pixel group. In order to eliminate a failure that a capacitance hanging in an FD area becomes large when a size of the amplification transistor of a pixel is too large and thus a charge voltage conversion gain is lowered, the size of the amplification transistor of the pixel is made smaller than the size of the amplification transistor configured for every pixel group.

However, the conventional RTN reduction technique is not a technique focused on the RTN. That is, detailed setting of a transistor for reducing the RTN impact has not been found.

SUMMARY

Example embodiments of the present invention include a photoelectric conversion element including a plurality of pixels to receive light; and a signal processor to process a signal of the pixels. The signal processor includes: a first element, being a transistor, having a first effective channel width through which a current can effectively pass through in the first element; and a second element, being a transistor, having a second effective channel width through which a current can effectively pass through in the second element. The first effective channel width of the first element is larger than the second effective channel width of the second element.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein:

FIGS. 10A and 10B are diagrams illustrating an example of an image indicating an image quality improvement effect when an effective channel width of the SF1 as the first element is relatively enlarged with respect to a channel width of transistors of pixels other than the SF1, according to the first embodiment;

FIGS. 11A and 11B are diagrams for explaining an impact on an image when the RTN is generated in a source follower transistor SF2, according a first example of the first embodiment;

Figure 1:
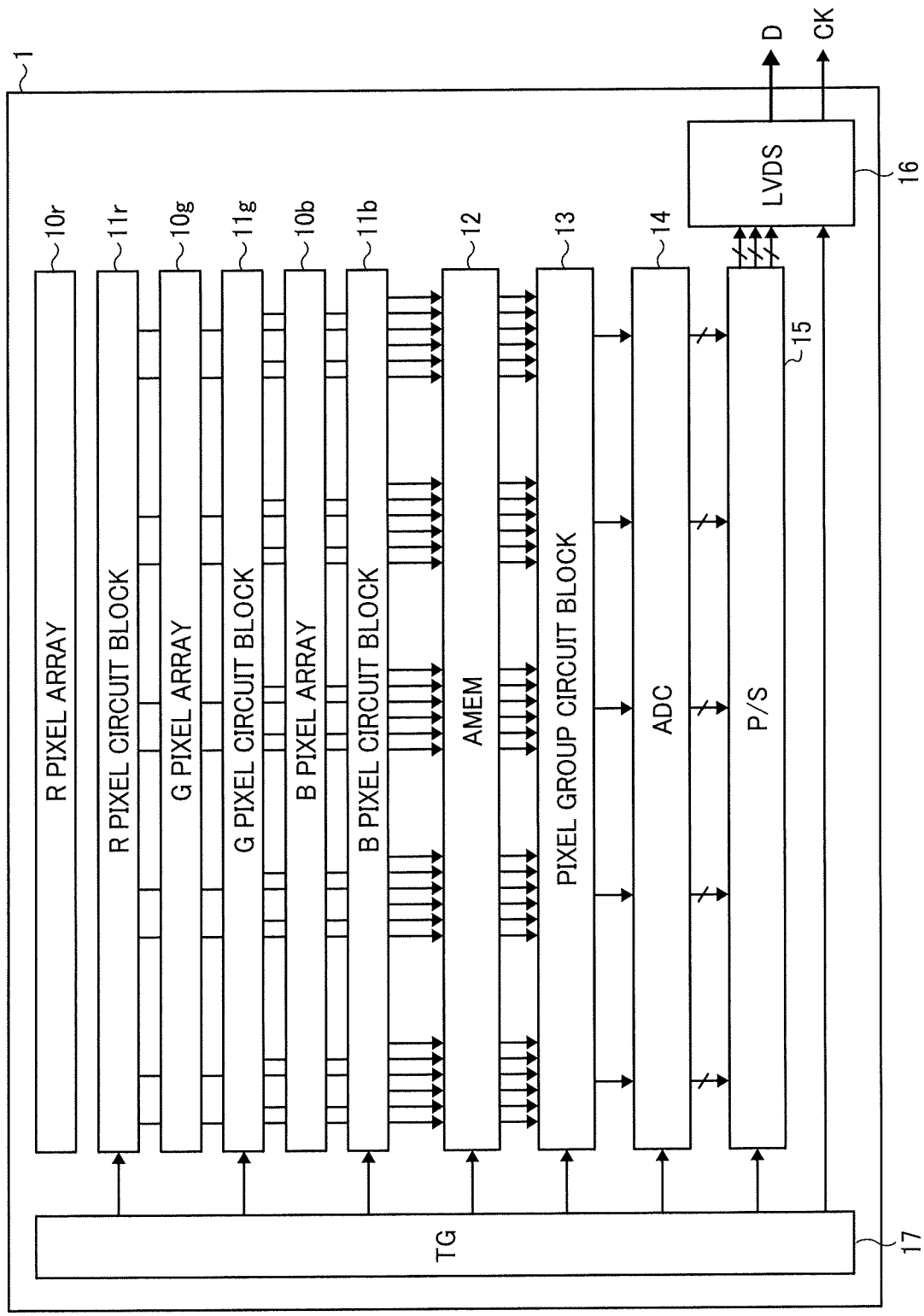
FIG. 1 is a diagram illustrating an example of an overall configuration of a photoelectric conversion element according to a first embodiment.

The accompanying drawings are intended to depict embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

An embodiment of a photoelectric conversion element, an image reading device, and an image forming device will be described in detail below with reference to the accompanying drawings.

Hereinafter, an example of application to a CMOS linear image sensor will be illustrated as an example of a photoelectric conversion element according to the embodiment. The photoelectric conversion element according to the embodiment is not limited to this configuration.

FIG. 1 is a diagram illustrating an example of an overall configuration of a photoelectric conversion element according to a first embodiment. FIG. 1 schematically illustrates an overall configuration of a CMOS linear image sensor 1 which is an example of the photoelectric conversion element. Although each arrow indicated in FIG. 1 represents a signal, a number of signals is not limited to the example illustrated in FIG. 2.

The CMOS linear image sensor 1 has a configuration in which a large number of photodiodes (PDs) for each color of RGB are one-dimensionally arrayed in a line direction. An R pixel array 10r, a G pixel array 10g, and a B pixel array 10b illustrated in FIG. 1 respectively represent all PDs for R (Red) color, G (Green) color, and B (Blue) color that are one-dimensionally arrayed in the line direction. Each pixel array (R pixel array 10r, G pixel array 10g, and B pixel array 10b) includes, for example, approximately 7000 PDs. Each PD is a pixel that receives light of each color through color filters of R color, G color, or B color. A subsequent stage of the PD is a signal processor including a pixel circuit and a pixel group circuit which process signals of pixels.

An R pixel circuit block 11r, a G pixel circuit block 11g, and a B pixel circuit block 11b respectively represent a pixel circuit for PD, which is included in each PD of the R pixel array 10r, the G pixel array 10g, and the B pixel array 10b. The pixel circuit converts a charge accumulated in the PD to a voltage signal, in the vicinity of the PD, and outputs the voltage signal to the subsequent stage.

An analog memory (AMEM) 12 holds a signal of each pixel of each color in an entire line direction, that is output through a readout line from the R pixel circuit block 11r, the G pixel circuit block 11g, and the B pixel circuit block 11b in a predetermined column unit.

In the linear image sensor, unlike an area sensor, signals are read independently from each pixel, and thus the readout line exists independently for every pixel. By adopting a configuration in which each signal read out from each pixel by the readout line is held in the AMEM 12, it is possible to achieve a global shutter method in which an operation timing of entire pixels, that is, an exposure timing is simultaneous.

A pixel group circuit block 13 reads out the signal of each pixel of each color held in the AMEM 12 in parallel in an order of RGB and buffers the signal in the above predetermined column unit.

The ADC 14 converts the signal in the predetermined column unit buffered by the pixel group circuit block 13 into digital data in parallel in the predetermined column unit.

The digital data converted in the predetermined column unit by the ADC 14 is output from each Analog-Digital-Converter (ADC) in parallel to a parallel-serial converter (P/S) 15 in the order of RGB, and data for every pixel of each color is held in the parallel-serial converter (P/S) 15. After various processes are performed, serial data of the held data is sequentially output to a Low Voltage Differential Signaling (LVDS) 16.

The LVDS 16 converts the serial data output from the P/S 15 into a low voltage differential serial signal D, and outputs same to a subsequent stage together with a clock signal CK input from a timing generator (TG) 17.

The TG 17 controls an operation of all the blocks described above by, for example, outputting a timing signal to all the blocks (R pixel circuit block 11r, G pixel circuit block 11g, B pixel circuit block 11b, AMEM 12, pixel group circuit block 13, ADC 14, P/S 15, and LVDS 16).

Figure 2:
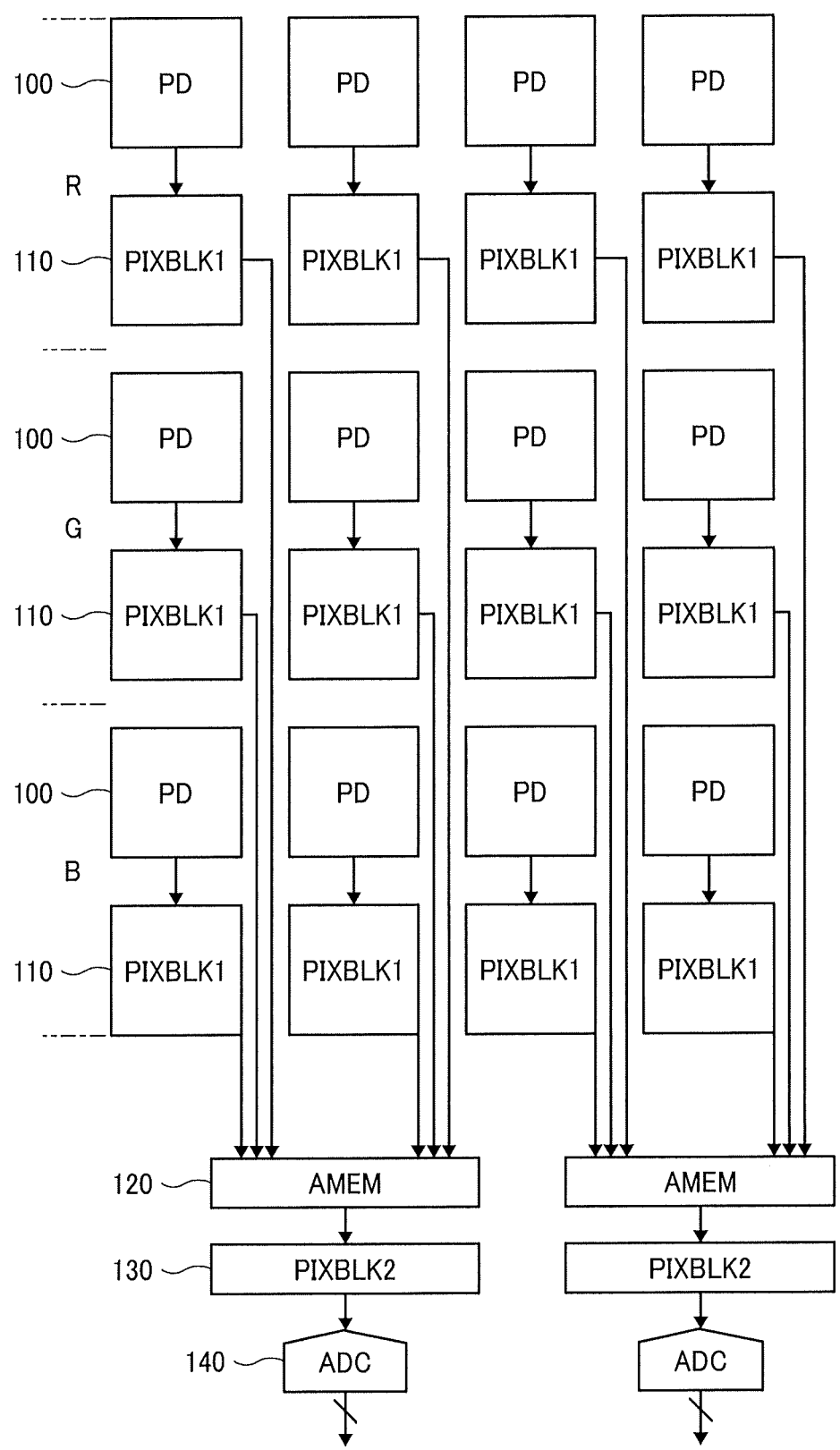
FIG. 2 is a diagram illustrating an example of a column configuration for processing a pixel signal of each color in a complementary metal oxide semiconductor (CMOS) linear image sensor.

FIG. 2 is a diagram illustrating an example of a column configuration for processing a pixel signal of each color in the CMOS linear image sensor 1. FIG. 2 illustrates, as an example, pixel signals of a total of six pixels including two pixels (Even/Odd) in each color, that is, a total of six pixels of Re (Even of R pixel), Ro (Odd of R pixel), Ge (Even of G pixel), Go (Odd of the G pixel), Be (Even of B pixel), and Bo (Odd of B pixel) are signal processed by sharing the circuit.

The arrows indicated in FIG. 2 represent same signals as those in FIG. 1. In addition, what is illustrated in FIG. 2 is a part of the entire pixel array of each color, and other pixel arrays are assumed to have a same column configuration.

In the present embodiment, in the CMOS linear image sensor 1, a pixel group circuit 130 and an ADC 140 are provided for each pixel group, with each group having a total of six pixels (that is, two pixels for each color of RGB), such that entire processing is performed in parallel to reduce an operation speed. Thus, overall speeding up of the linear image sensor is achieved. The parallel processing for every six pixels by the above column configuration is an example, and a number of pixels to be processed in parallel is not limited to six. In addition, the above column configuration is not limited to two pixels (Even/Odd), and other combinations may be possible.

In FIG. 2, each PD 100 arrayed in an R area is a PD included in the R pixel array 10r (see FIG. 1), each PD 100 arrayed in a G area is a PD included in the G pixel array 10g (see FIG. 1), and each PD 100 arrayed in a B area is a PD included in the B pixel array 10b (see FIG. 1). In addition, each PIXBLK 1 (pixel circuit) 110 arrayed in the R area is each pixel circuit of the R pixel circuit block 11r (see FIG. 1), each PIXBLK 1 (pixel circuit) 110 arrayed in the G area is each pixel circuit of the G pixel circuit block 11g (see FIG. 1), and each PIXBLK 1 (pixel circuit) 110 arrayed in the B area is each pixel circuit of the B pixel circuit block 11b (see FIG. 1).

The AMEM 120 is an analog memory for which the AMEM 12 (see FIG. 1) are illustrated in the column unit. A PIXBLK 2 (pixel group circuit) 130 is a pixel group circuit illustrated in the column unit of the pixel group circuit block 13 (see FIG. 1). The ADC 140 is an ADC for which the ADC 14 (see FIG. 1) is illustrated in the column unit.

In the configuration illustrated in FIG. 2, a series of pixel processes ("process for every pixel"), from outputting an accumulated charge of each PD 100 as a pixel signal from each pixel circuit 110 to holding the charge in the AMEM 120, are performed in parallel in all pixels. Buffering in the pixel group circuit 130 and AD-conversion processing ("processing for each pixel group") in the ADC 140 in the subsequent stage are performed in parallel for every six pixels. That is, the subsequent stage has a column ADC configuration in which each two pixels of each color of RGB share one ADC 140. With this column ADC configuration, for example, Even pixels or Odd pixels of a same color is simultaneously AD-converted in an arrangement in the line direction of each RGB. In addition, since the processing is performed in the order of RGB, a relation of Re-Ro-Ge-Go-Be-Bo is time-series (serial) in a processing block of the pixel group circuit 130 and in a processing block after the pixel group circuit 130.

Figure 3:
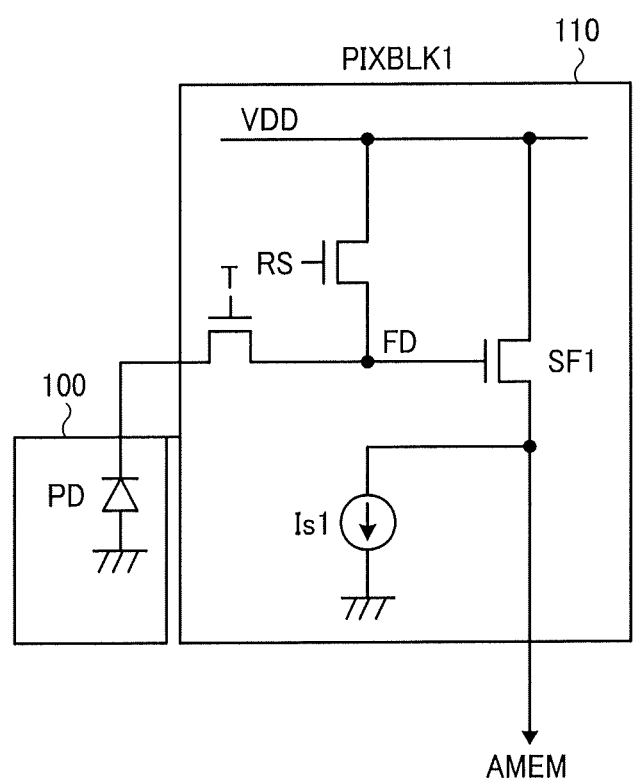
FIG. 3 is a diagram illustrating an example of a configuration of a pixel circuit of a photodiode (PD)

Next, a specific circuit configuration of each part will be described. FIG. 3 is a diagram illustrating an example of a configuration of a pixel circuit of the PD 100. In FIG. 3, the PD 100 corresponds to the PD 100 illustrated in FIG. 2, and accumulates charges according to an exposure time by photoelectrically converting light. The pixel circuit 110 includes a transfer transistor (T) that transfers charges of the PD 100 to a floating diffusion (FD), a reset transistor (RS) that resets the FD, and a source follower transistor (SF1) that buffers an FD voltage and outputs same to the readout line. A bias current source (Is1) is coupled to the SF1.

Figure 4:
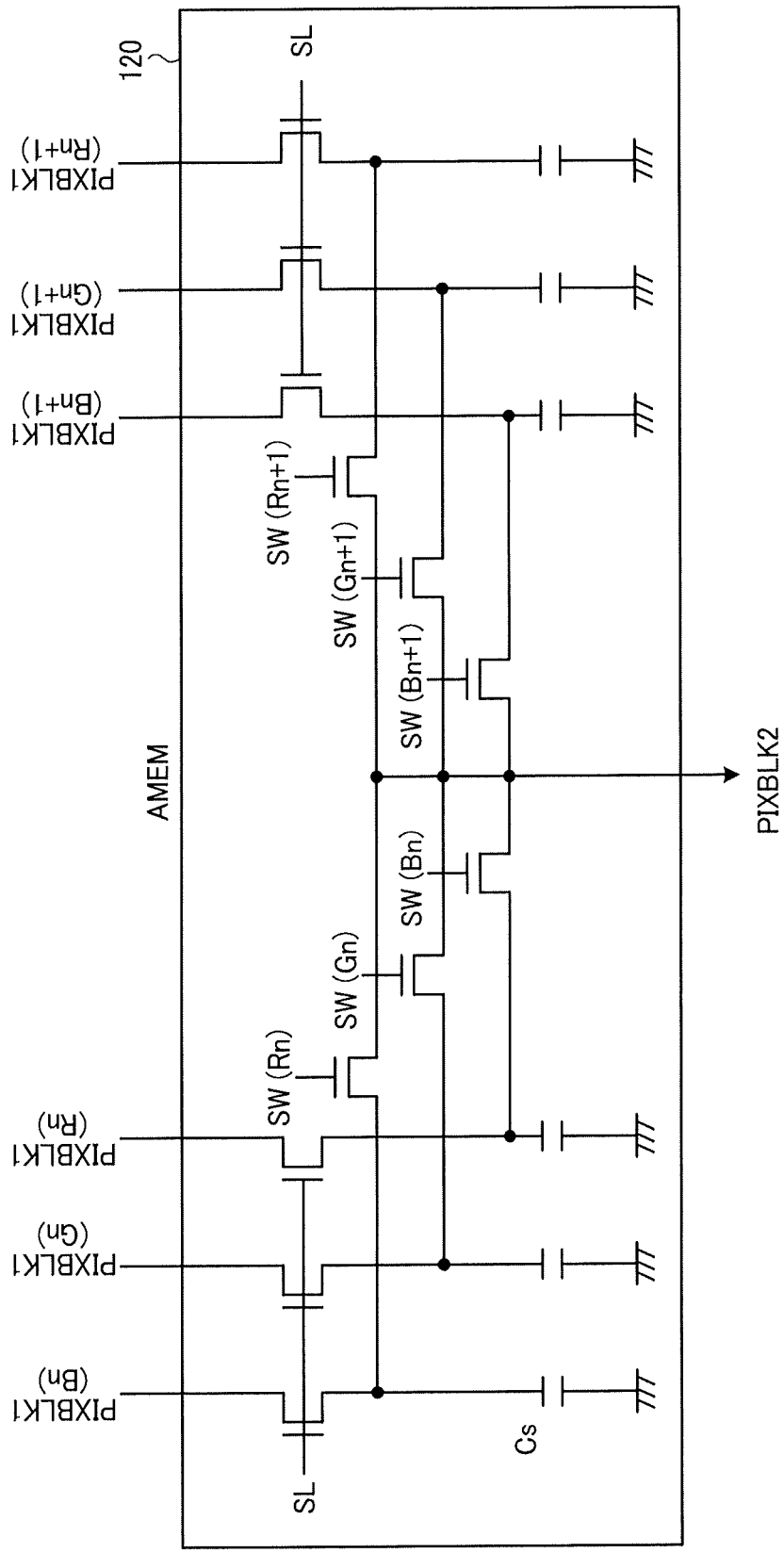
FIG. 4 is a diagram illustrating an example of a configuration of an analog memory (AMEM)

FIG. 4 is a diagram illustrating an example of a configuration of the AMEM 120. The AMEM 120 illustrated in FIG. 4 includes a selection switch (SL), a signal holding capacity (Cs), and a selection switch (SW (**)) for reading out a signal from the Cs to the pixel group circuit 130.

All pixels operate at a same time until the signal is held in the AMEM 120, and signal reading from the AMEM 120 is performed for one pixel at a time in an order of Re, Ro, Ge, Go, Be, and Bo.

Figure 5:
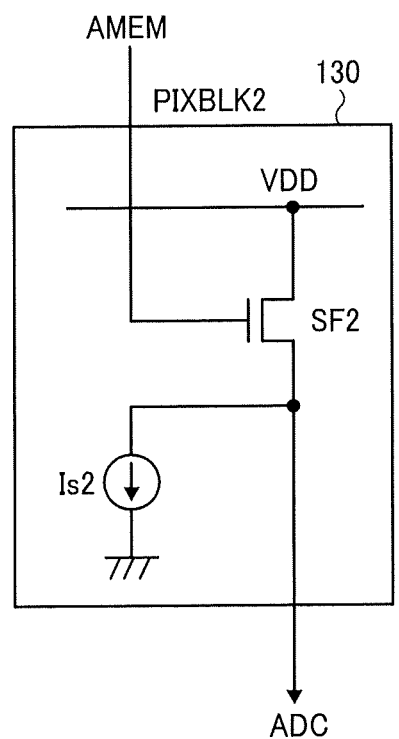
FIG. 5 is a diagram illustrating an example of a configuration of a pixel group circuit.

FIG. 5 is a diagram illustrating an example of a configuration of the pixel group circuit 130. The pixel group circuit 130 illustrated in FIG. 5 is configured with a source follower transistor (SF2) and a bias current source (Is2) of the SF2, buffers the signal output from the AMEM 120, and outputs the signal to the ADC 140. As described above, since the signal is read out for one pixel at a time in the order of Re, Ro, Ge, Go, Be, and Bo from the AMEM 120, the signal is output in this order. That is, in the SF2 and the ADC 140 in the subsequent stage, six pixels of Re, Ro, Ge, Go, Be, and Bo share circuits.

Next, an impact of a noise generated in the MOS transistor will be described. In recent years, miniaturization of CMOS process has progressed, and the impact of Random-Telegraph-Noise (RTN) is becoming apparent. The generation principle of this RTN and its impact will be described below with reference to FIGS. 6A and 6B. It is assumed that the principle and impact of the RTN occur similarly in both N-type MOS transistors and P-type transistors.

Figure 6B:
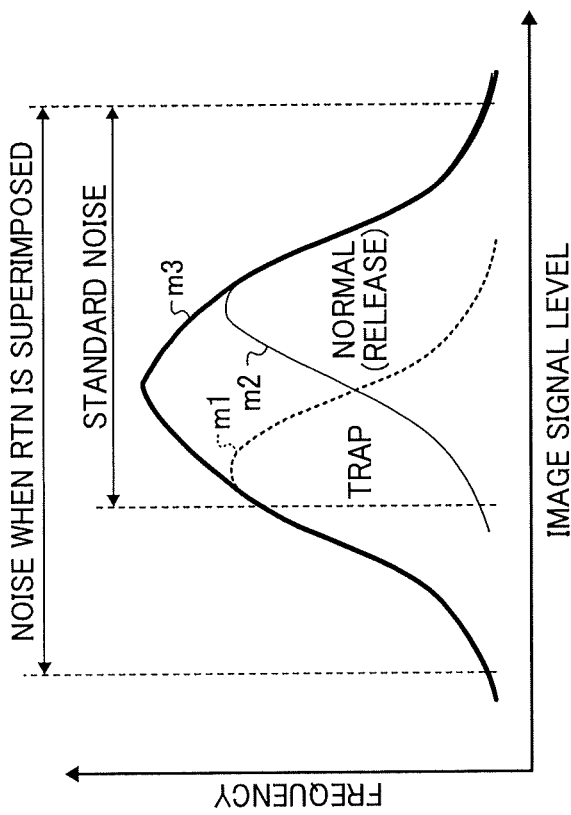
FIGS. 6A and 6B are explanatory diagrams of a generation principle of an RTN generated in a metal oxide semiconductor (MOS) transistor.
Figure 6A:
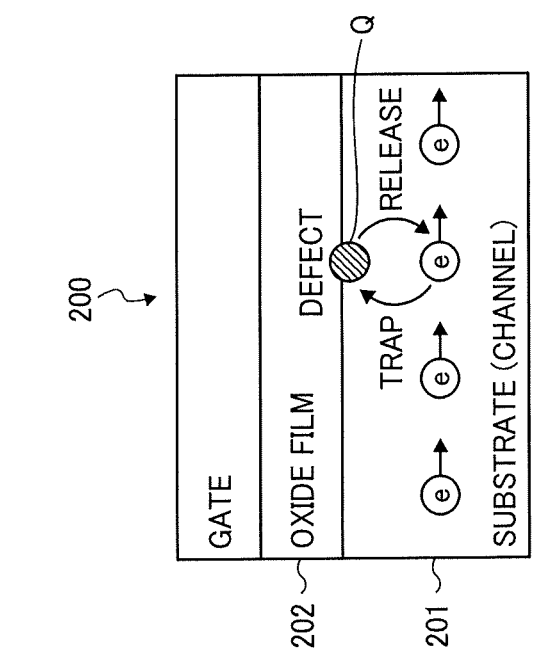

FIGS. 6A and 6B are explanatory diagrams of a generation principle of an RTN generated in a N-type MOS transistor. As illustrated in FIG. 6A, the RTN is a noise due to a crystal defect Q of a silicon wafer 201, and is considered to be caused by random capture (trapping) and emitting (release) of electrons e by an interface state of a gate oxide film 202 of a MOS transistor 200.

FIG. 6B illustrates a relation between an image signal level and a frequency. When considering the RTN impact due to the crystal defect Q, the image signal level takes two values of a state where the electrons e are captured (trapped) and a state where the electrons e are emitted (released). A random noise component in the respective two values indicates a normal distribution, and the state where the electrons e are emitted (released) is equivalent to a normal state. In FIG. 6B, the normal distribution in the captured (trapped) state is indicated by a broken line m1 and the normal distribution in the emitted (released) state is indicated by a solid line m2. A pixel in which the RTN is generated exhibits a behavior such that normal distributions of respective two values are combined. Therefore, as indicated by a thick solid line m3 in FIG. 6B, the pixel will have a larger noise than a standard noise generated in the normal state.

Figure 7A:
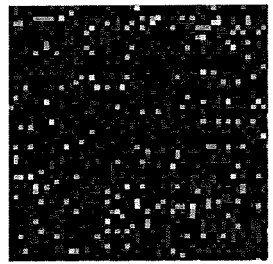
FIGS. 7A and 7B are diagrams for explaining an impact on an image by the RTN.
Figure 7B:
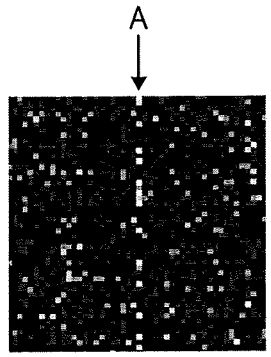

FIGS. 7A and 7B are diagrams for explaining an impact on an image by an RTN. FIG. 7A illustrates an image in a case where no RTN is generated, and FIG. 7B illustrates an image in a case where an RTN is generated.

As illustrated in FIG. 7B, when the RTN is generated, a vertical streak A appears compared to an image of FIG. 7A where no RTN is generated. In the CMOS linear image sensor that reads an image one-dimensionally, if the source follower transistor (SF1) of the pixel illustrated in FIG. 3 is affected by the RTN, the vertical streak A appears at a position on an image corresponding to the pixel. In particular, human visibility is highly sensitive to nonrandom level change like a streak, and thus the pixel is greatly affected as image quality deterioration. Since an area sensor reads an image in two dimensions, the RTN impact appears as random dot-like noise, and its impact as image quality deterioration is small. That is, in the linear image sensor, the RTN needs to be reduced more than the area sensor.

The image illustrated in FIG. 7B is an example in a case where the RTN is generated in the SF1 of one pixel, and thus a vertical streak is generated in only one pixel. This is because the SF1 is configured for every pixel.

There is a possibility that a vertical streak of one pixel may be similarly generated in a case of a transistor configured for every pixel in the same manner as the SF1, such as various transistors in the pixel circuit 110 (see FIG. 3), the current source Is1, and selection switches (SW (*), SL) in the AMEM 120 (see FIG. 4).

Meanwhile, the present inventor(s) have found that the RTN impact increases as an input of the transistor is in a higher impedance state. This will be described with reference to FIGS. 8A, 8B, and 8C.

Figure 8A:
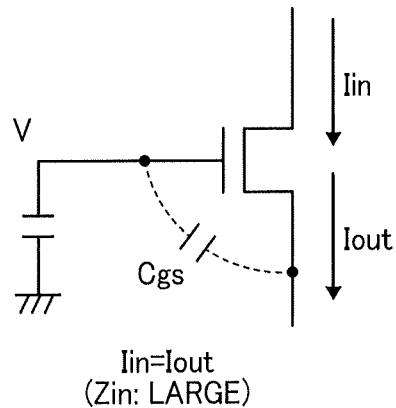
FIGS. 8A, 8B, and 8C are explanatory diagrams of a transistor operation model due to an RTN impact.
Figure 8B:
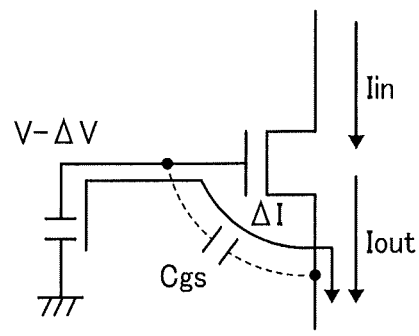
Figure 8C:
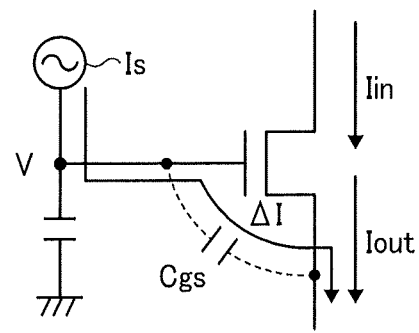

FIGS. 8A, 8B, and 8C are explanatory diagrams of a transistor operation model due to the RTN impact. FIG. 8A illustrates a basic operation model of the transistor, and FIG. 8B illustrates an operation model in a state where the RTN is generated. As illustrated in FIG. 8A, in a transistor in any operation state, a current normally flows between a drain and a source in a state where an arbitrary voltage (indicated by V here) is applied to a gate. At this time, a current (Iin) flowing into the drain and a current (Iout) flowing out from the source are equal except for minute leakage current and the like.

However, when the electrons e are in a state of being captured in the crystal defect Q (the state illustrated in FIG. 6A), the electrons e are lost in the transistor, and the current Iout decreases instantaneously with respect to the flowing current Iin. As illustrated in FIG. 8B, a change in this Tout, i.e., a source current appears as if the source voltage changes as viewed from the gate, and the change in the source voltage returns to a gate side through a capacitance (Cgs) between the gate and the source. That is, the change in the source voltage kicks back to the gate side, and the gate voltage changes by ΔV. When this is grasped from a viewpoint of the current, it can be interpreted that the current (source current) Tout is changed and a reduced current is compensated by supplying a current (ΔI) from a capacitive load on the gate side, and the gate voltage changes by ΔV. Afterwards, the gate voltage change ΔV is amplified by the transistor and becomes a large current change, and the RTN impact is transmitted to the subsequent stage.

Meanwhile, when the gate has a low impedance, the RTN impact is lowered. This will be described with reference to FIG. 8C. This is the same as the above description until the electrons e are captured by the crystal defect Q and the change in the source voltage instantaneously kicks back to the gate side. However, when the gate has a low impedance, the impact thereof is absorbed by a signal source or the like which is a low impedance node, and no change occurs in the gate voltage. When this is grasped from a viewpoint of the current, it can be interpreted that the source current Tout is changed and a reduced current is compensated by supplying a current (ΔI) from a signal source Is, not from the capacitive load on the gate side, and thus the gate voltage does not change. At this time, since the gate voltage does not change, even if the voltage is amplified by the transistor, the RTN impact transmitted to the subsequent stage is small.

In FIGS. 8A, 8B, and 8C, an example in which the capacitive load is coupled to the gate has been described as a case of a high impedance; however, the present invention is not limited to this example.

As described above, the influence of the RTN increases as the input (gate) side of the transistor has a higher impedance. In the linear image sensor of the present embodiment, the operation model illustrated in FIG. 8B corresponds to a case of a use as an amplification transistor (buffer) such as the SF1 (see FIG. 3) and the SF2 (see FIG. 5). The above buffer corresponds to this operation model because the FD and the analog memory (Cs) are coupled to the gate and the gate voltage is in a high impedance state. FIG. 8C corresponds to a switching transistor such as the RS and T (see FIG. 3), the SL, and the SW (*) (see FIG. 4). Since the gate voltage of the switching transistor is controlled in a low impedance, the switching transistor corresponds to this operation model.

From the above, it is understood that it is desirable to flow a channel current (electrons e) while avoiding the crystal defect Q (see FIG. 6A) in order to reduce the RTN.

Therefore, in the present embodiment, in the channel width of FIG. 6A, an area where a current can effectively flow, specifically, an area where the crystal defect Q is avoided and a channel current (electrons e) is flowing or can flow is defined as an effective channel width, and a transistor greatly affected by the RTN is configured so as to have a larger effective channel width.

Hereinafter, a transistor greatly affected by the RTN (that is, a contribution degree to image quality degradation is large) corresponds to a "first element" (which may be also referred to as a "first transistor"), and a transistor less affected by the RTN that is to be compared to the RTN of the "first element" (that is, a contribution degree to image quality degradation is small) corresponds to a "second element" (which may be also referred to as a "second transistor"). In the present embodiment, the effective channel width of the transistor of the SF1 (see FIG. 3) among the transistors formed for every pixel is made larger than the effective channel width of the transistors of the pixel circuit 110 other than SF1. That is, in this embodiment, the SF1 is the "first element", and other than the SF1 is the "second element".

Figure 9A:
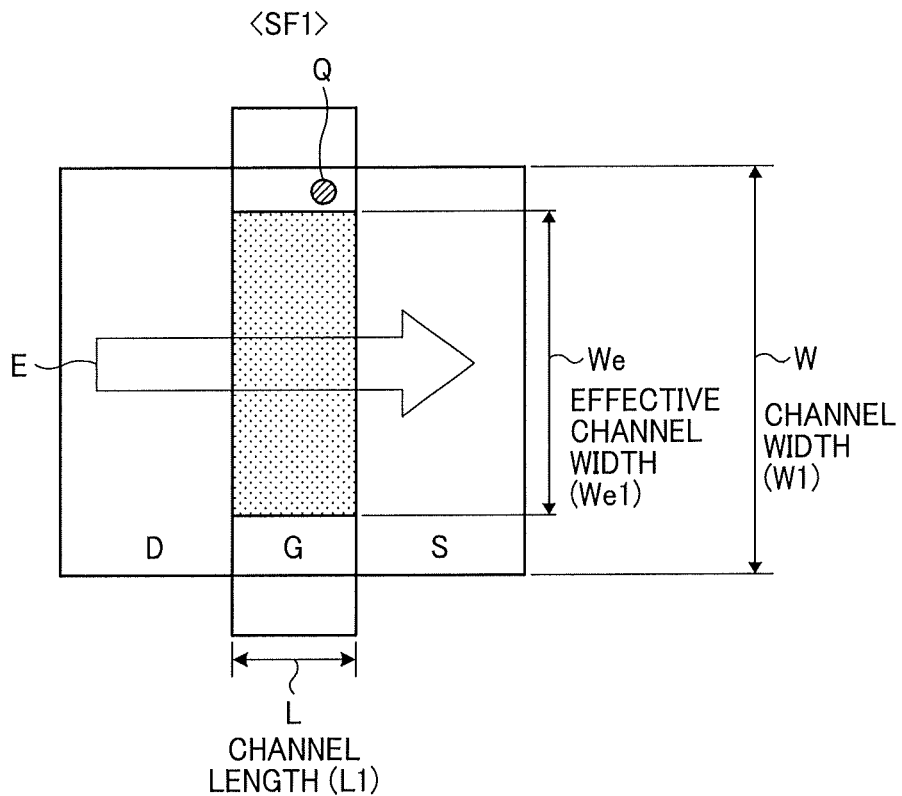
FIGS. 9A and 9B are diagrams illustrating an example of a configuration in which an effective channel width of a source follower transistor (SF1), as the first element, is made larger than an effective channel width of other than the SF1, according to the first embodiment.
Figure 9B:
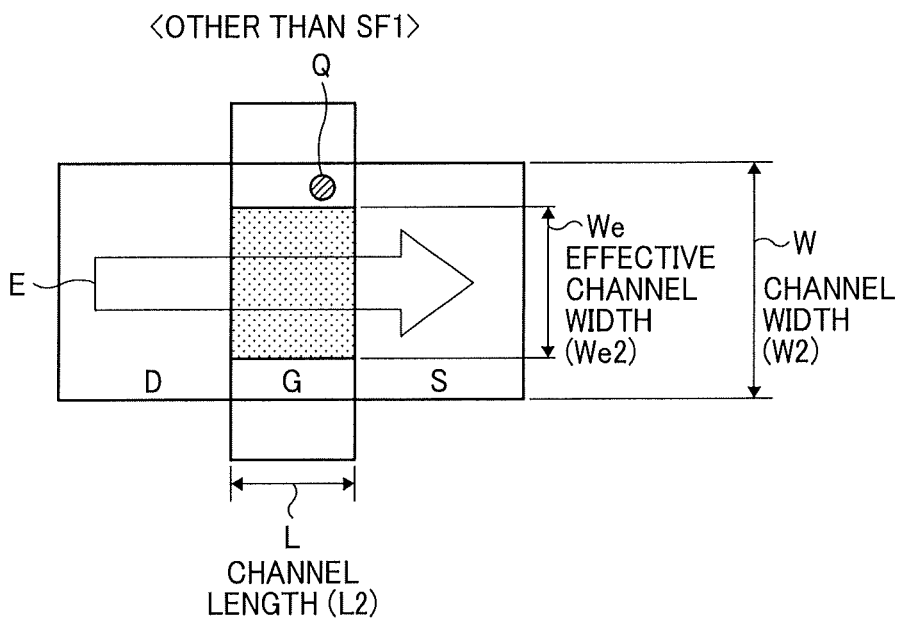

FIGS. 9A and 9B are diagrams illustrating an example of a configuration in which the effective channel width of the SF1 is made larger than the effective channel width of other than the SF1. FIGS. 9A and 9B illustrate a configuration of a channel in a plan view as viewed from above of the N-type MOS transistor 200 in FIG. 6A. FIG. 9A illustrates a configuration of the SF1, FIG. 9B illustrates a configuration of other than the SF1 such as RS and T (see FIG. 3), SL, and SW (*) (FIG. 4).

In FIG. 9A, a drain (D), a gate (G), and a source (S) are illustrated, and the channel is right under the gate (G). In general, a length L of a direction E in which a current (electrons e) flows is called a channel length, and a width in a direction orthogonal thereto is called a channel width. In the present embodiment, a width W indicated in FIG. 9A is called the channel width.

Here, when a crystal defect Q affecting the channel is present, the current (electrons e) flowing through the crystal defect Q is a factor of the RTN, and thus the crystal defect Q portion is considered to be an invalid area as a current. In addition, a portion where the current does not flow even if there is no crystal defect Q, or the current cannot structurally flow is also considered as the invalid area.

Therefore, in the present embodiment, a channel width We of an area where there is no crystal defect Q on a current flowing path and where the current is flowing or structurally can flow (area of a shaded part in FIG. 9A) is referred to as an effective channel width, which is distinguished from a channel width W that is generally used. Since the effective channel width We is a width where the channel current can flow avoiding the RTN impact, and thus the larger the effective channel width We is, the larger the reduction effect of the RTN is. This is because whether a current (electrons e) flows in the crystal defect Q portion is random and determined stochastically, and thus as the effective channel width We increases, a probability that the current flows in a normal portion where there is no crystal defect Q becomes higher. Also, with regard to FIG. 9B, the description so far is the same as the description regarding FIG. 9A.

The differences between FIG. 9A and FIG. 9B include a difference in the effective channel width We in addition to a difference in a size of the transistor.

The transistor of the SF1 in FIG. 9A is provided with a large effective channel width We, and with regard to the transistors for every pixel (RS, T, SL, SW (*), etc.) other than the SF1 in FIG. 9B, the effective channel width We is relatively small. That is, there is a relation that an effective channel width We1>an effective channel width We2.

As explained with reference to FIGS. 8A, 8B, and 8C, a transistor having a large contribution degree of the RTN among transistors for every pixel is the SF1. Therefore, by relatively enlarging the effective channel width We of the SF1, the RTN impact can be reduced with a minimum necessary configuration. That is, the image quality can be effectively improved.

Although the current source (Is1) of the SF1 among the transistors for every pixel is generally a current mirror circuit, there are cases where an impedance on the input side is not as high as an impedance of the SF1, but the RTN impact becomes large. Accordingly, in a case of such a configuration, the same applies to the amplification transistor SF1 of the current source Is1. That is, the effective channel width of the amplification transistor SF1 of the current source Is1 may be made larger than the effective channel width of transistors other than the current source Is1.

FIGS. 10A and 10B are diagrams illustrating an example of an image indicating an image quality improvement effect when the effective channel width We of the SF1 is relatively enlarged with respect to the channel width We of transistors of pixels other than the SF1.

FIG. 10A illustrates an image (corresponding to FIG. 7B) output by a conventional channel design, and FIG. 10B illustrates an image output by a channel design illustrated in this embodiment.

As illustrated in FIG. 10B, in the channel design described in this embodiment, the RTN is effectively reduced, and thus the vertical streak A due to pixels becomes unnoticeable and image quality is improved.

As described above, by relatively increasing the effective channel width of the transistor having a large contribution degree of the RTN, the RTN impact is reliably reduced and image quality is improved.

While an example of a negative-channel metal oxide semiconductor (NMOS) has been illustrated as an example in this embodiment, the same applies to a positive-channel metal oxide semiconductor (PMOS), and the following each modified example also applies to any type regardless of a type of P type and N type.

The above-described embodiment may be implemented in various ways as described below referring to first to fifth modified examples.

(Example 1)

In the embodiment, the impact on the image by the RTN for every pixel (vertical streak A for one pixel) caused by the SF1 (see FIG. 3) and the like has been described, but similarly to the SF1, there is a possibility that the RTN may be generated in the SF2 (see FIG. 5), and the impact on the image when the RTN is generated in the SF2 becomes more remarkable. In this first example, the impact on the image by the RTN of the SF2 will be illustrated, and a channel configuration of the SF2 for reducing the impact will be illustrated.

FIGS. 11A and 11B are diagrams for explaining an impact on an image when the RTN is generated in the SF2. FIG. 11A illustrates an image in a case where a vertical streak A in a pixel unit due to the SF1 is generated, and FIG. 11B illustrates an image in a case where a vertical streak B in a pixel group unit due to the SF2 is generated.

When the vertical streak A and the vertical streak B are compared, the vertical streak B becomes more noticeable than the vertical streak A and becomes more visible. This is because the RTN of the SF1 affects only one pixel, whereas the RTN of the SF2 affects a pixel group. Specifically, in the column configuration illustrated in FIG. 2, because of the column configuration of a total of six pixels including two pixels (Even/Odd) in each color of RGB, all RGB colors are affected, and the RTN impact appears on two consecutive pixels (Even and Odd), which is because that, compared to a case of only one pixel, a vertical streak becomes more visible in terms of density and width.

This comparative image suggests that it is desirable to reduce the RTN preferentially for transistors shared by a plurality of pixels in reducing the RTN impact in a column ADC type CMOS linear image sensor.

Therefore, in the first modified example, the effective channel width of the SF2 of the transistor configured for every pixel group is made larger than the effective channel of other transistors (for example, Is2) of the pixel group circuit (130).

Figure 12A:
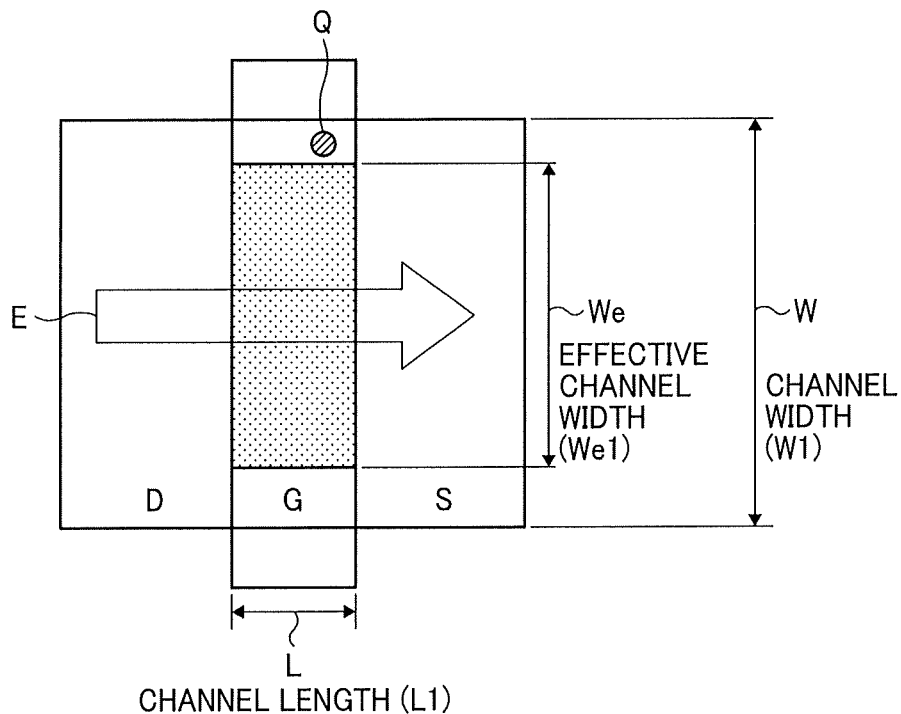
FIGS. 12A and 12B are diagrams illustrating an example of a configuration in which the effective channel width of the SF2 as the first element is made larger than the effective channel width of other than the SF2, according to the first example of the first embodiment.
Figure 12B:
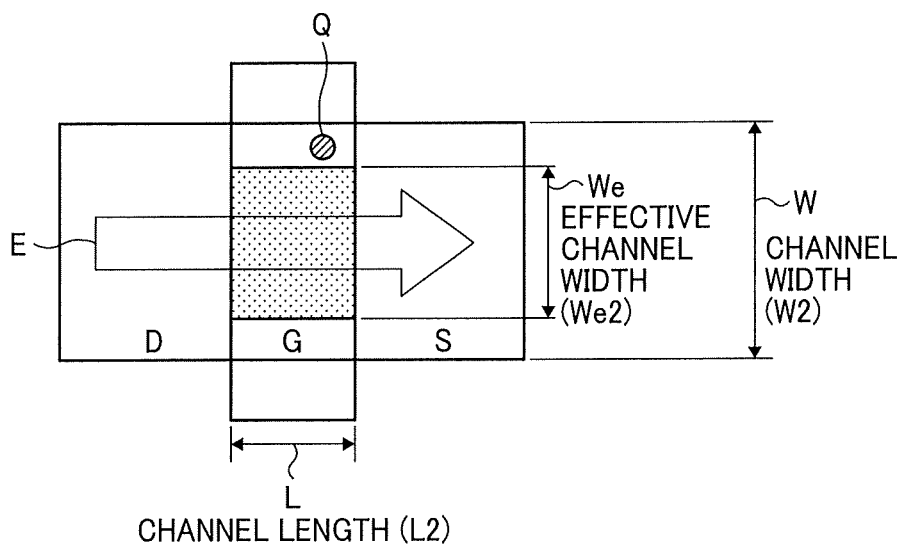

FIGS. 12A and 12B are diagrams illustrating an example of a configuration in which the effective channel width of the SF2 is made larger than the effective channel width of other than the SF2. In FIGS. 12A and 12B, parts corresponding to FIGS. 9A and 9B are given the same reference numerals.

As illustrated in FIG. 12A, the effective channel width We of the SF2 is set larger than the effective channel width We of other than the SF2 illustrated in FIG. 12B. A relation between each effective channel width We illustrated in FIG. 12A and FIG. 12B is the effective channel width We1>the effective channel width We2. Other configurations are the same as those described with reference to FIGS. 9A and 9B, and explanation will be repeated and thus will be omitted here.

Figure 13A:
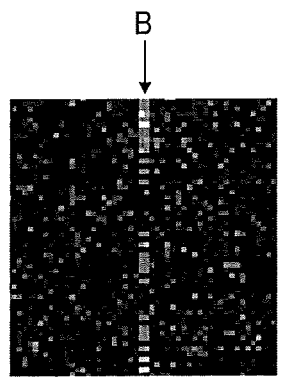
FIGS. 13A and 13B diagrams illustrating an example of an image indicating an image quality improvement effect when an effective channel width of the SF2 as the first element is relatively enlarged with respect to a channel width of transistors of pixels other than the SF2, according to the first example of the first embodiment.
Figure 13B:
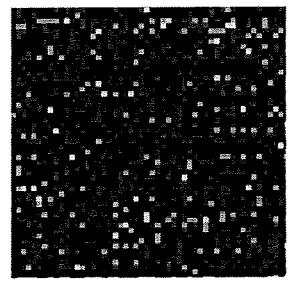

FIGS. 13A and 13B are diagrams illustrating an example of an image indicating an image quality improvement effect when the effective channel width We of the SF2 is relatively enlarged with respect to the channel width We of transistors of pixels other than the SF2.

FIG. 13A illustrates an image (corresponding to FIG. 11B) output by a conventional channel design, and FIG. 13B illustrates an image output by a channel design illustrated in this first example.

As illustrated in FIG. 13B, in the channel design illustrated in this first example, the RTN of particularly greatly affected SF2 is effectively reduced, and thus the vertical streak B due to a pixel group becomes unnoticeable and image quality is improved.

(Example 2)

As described in the first example, the RTN due to the pixel group has a greater impact than the RTN due to pixels. Therefore, in the following second example, by increasing the effective channel width of the transistor configured for every pixel group such as the SF2 rather than the effective channel width of the transistor configured for every pixel such as the SF1, it is possible to reduce the RTN impact for an entire image with a minimum necessary configuration.

Figure 14A:
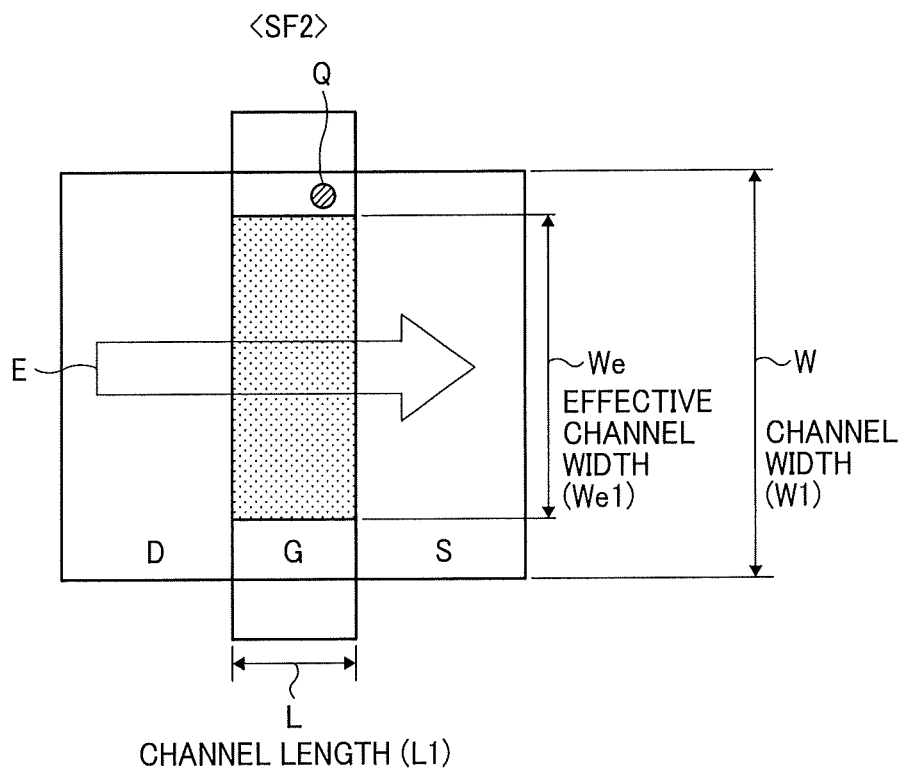
FIGS. 14A and 14B are diagrams illustrating an example of a configuration for reducing the impact by the RTN for an entire image, according to the second example of the first embodiment.
Figure 14B:
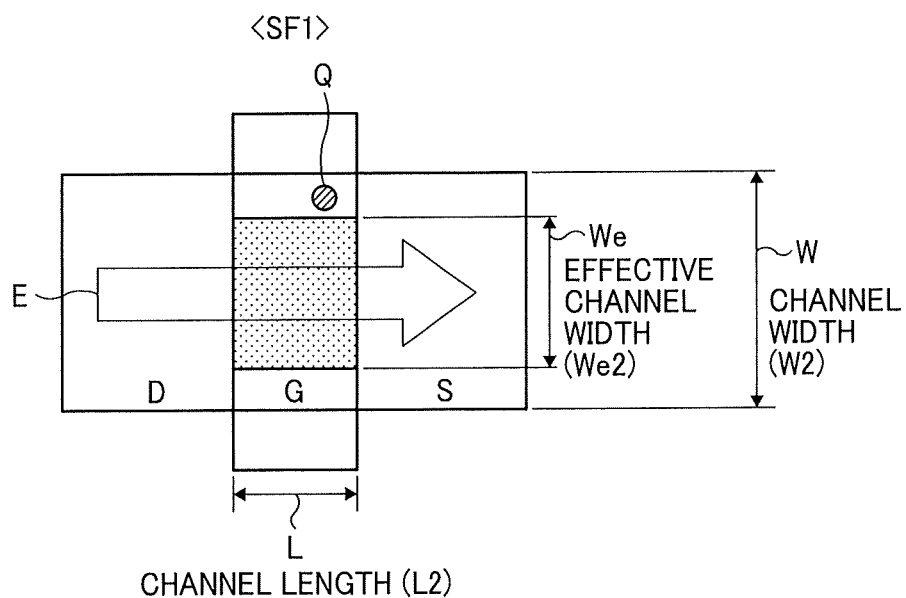

FIGS. 14A and 14B are diagrams illustrating an example of a configuration for reducing the impact by the RTN for an entire image. In FIGS. 14A and 14B, parts corresponding to FIGS. 9A and 9B are given the same reference numerals.

As illustrated in FIG. 14A, the effective channel width We of a transistor configured for every pixel group such as the SF2 is set larger than the effective channel width We of a transistor configured for every pixel such as the SF1 illustrated in FIG. 14B. A relation between each effective channel width We illustrated in FIG. 14A and FIG. 14B is the effective channel width We1>the effective channel width We2.

A width/length (W/L) ratio is a main factor determining characteristics of the transistor, and when the W/L ratio changes, the characteristics of the transistor will change. In order to avoid this, for example, the W/L ratio is set to W1/L1=W2/L2. By doing so, it is possible to increase the effective channel width while maintaining the W/L ratio, that is, matching the characteristics of the transistors between the configuration illustrated in FIG. 14A and the configuration illustrated in FIG. 14B.

Other configurations are the same as those described with reference to FIGS. 9A and 9B, and explanation will be repeated and thus will be omitted here.

Figure 15A:
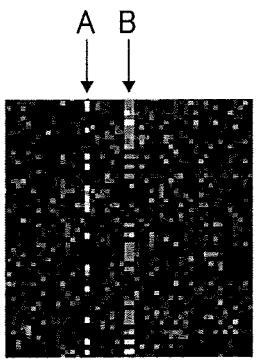
FIGS. 15A and 15B are diagrams illustrating an example of an image illustrating an image quality improvement effect when the effective channel width We of a transistor configured for every pixel such as the SF2 is relatively enlarged with respect to the effective channel width We of a transistor configured for every pixel group such as the SF1, according to the second example of the first embodiment.
Figure 15B:
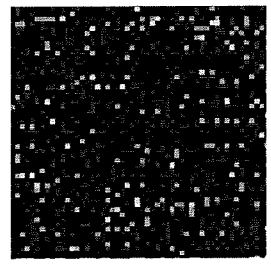

FIGS. 15A and 15B are diagrams illustrating an example of an image illustrating an image quality improvement effect when the effective channel width We of a transistor configured for every pixel group such as the SF2 is relatively enlarged with respect to the effective channel width We of a transistor configured for every pixel such as the SF1.

FIG. 15A illustrates an image output by a conventional channel design, and FIG. 15B illustrates an image output by a channel design illustrated in this embodiment.

As illustrated in FIG. 15A, conventionally, when the RTN is generated in a transistor for every pixel and the RTN is generated even in a transistor for every pixel group, the vertical streak A and the vertical streak B are generated in an image.

However, as illustrated in FIG. 15B, in the channel design illustrated in the second example, since the RTN generated in the transistor for every pixel and the RTN generated in the transistor for every pixel group are both reduced, both the vertical streak A due to pixels and the vertical streak B due to a pixel group become unnoticeable and image quality is improved.

Each channel design (FIGS. 9A, 9B, 12A, 12B, 14A, and 14B) described in the embodiment, the first example, and the second example is an independent configuration, and it is possible to exhibit a further RTN reduction effect by combining these.

Further, as described in FIGS. 8A, 8B, and 8C, the effective channel width can exhibit more effect by being applied to a transistor whose input side is in a high impedance (floating) state, even if the transistor is other than the SF1 and the SF2.

(Example 3)

So far, a method of enlarging the channel width has been described as a method of enlarging the effective channel width. When enlarging the channel width, a size of one transistor may be simply increased, but a plurality of small size transistors may be arranged in parallel to equivalently make up a large size transistor.

Therefore, in this third example, an example is illustrated in which an equivalently large size transistor is formed by arranging small size unit transistors (transistor elements) in parallel. Thus, variation among transistors are reduced.

Figure 16A:
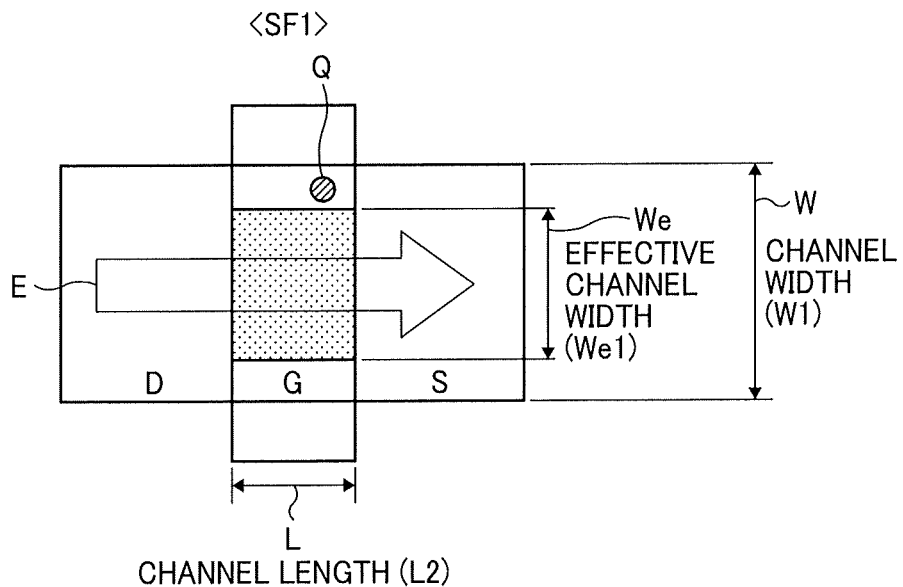
FIGS. 16A and 16B are diagrams illustrating an example of a configuration for equivalently enlarging the effective channel width by arranging transistors in parallel, according to a third example of the first embodiment.
Figure 16B:
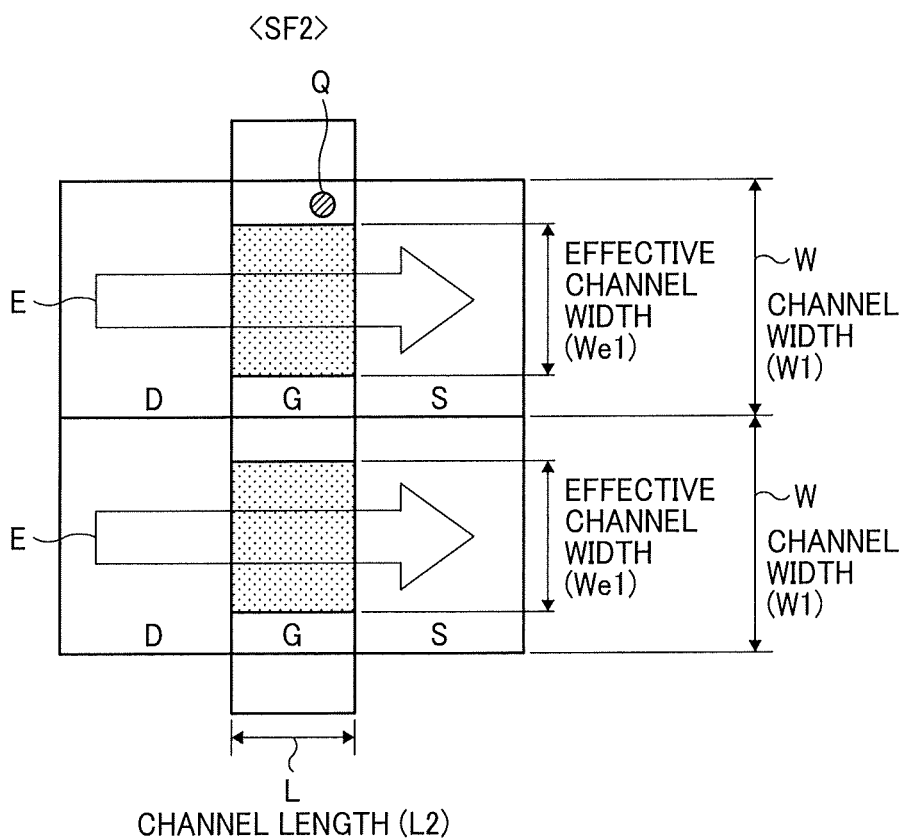

FIGS. 16A and 16B are diagrams illustrating an example of a configuration for equivalently enlarging the effective channel width by arranging transistors in parallel.

FIG. 16A illustrates a configuration of the SF1, and FIG. 16B illustrates a configuration of the SF2. The transistor in FIG. 16A is used as a unit transistor. In FIG. 16B, two unit transistors of FIG. 16A are arranged in parallel. The two unit transistors in FIG. 16B are electrically coupled by short-circuiting each electrode. At this time, in the configuration illustrated in FIG. 16B, the channel is twice as large as the channel of the unit transistor, and therefore the width that the current (electrons e) can flow is doubled, and the effective channel width We can be enlarged as a whole in the same manner as when the size of one transistor is physically increased.

In this way, in order to enlarge the effective channel width We, it is possible to configure an equivalently large size transistor by combining small size unit transistors in parallel. Thus, the effective channel width is enlarged while reducing variation among the unit transistors.

In a case of the configuration illustrated in FIG. 16B, since same transistors are simply arranged in parallel, the transistor illustrated in FIG. 16A and the transistor illustrated in FIG. 16B have a different W/L ratio (ratio of channel width/channel length). The W/L ratio is such that, when the configuration of FIG. 16A is set to "1", the configuration of FIG. 16B is "2". In order to avoid this, for example, N transistors with a W/L ratio of 1/N (where N is a natural number) are arranged in parallel. By doing so, it is possible to enlarge the effective channel width while maintaining the W/L ratio with the configuration illustrated in FIG. 16A, that is, matching the characteristics of the transistors.

Further, the present inventor(s) have also found an optimum ratio between the channel width of the SF1 (transistor for every pixel) and the channel width of the SF2 (transistor for every pixel group).

Figure 17:
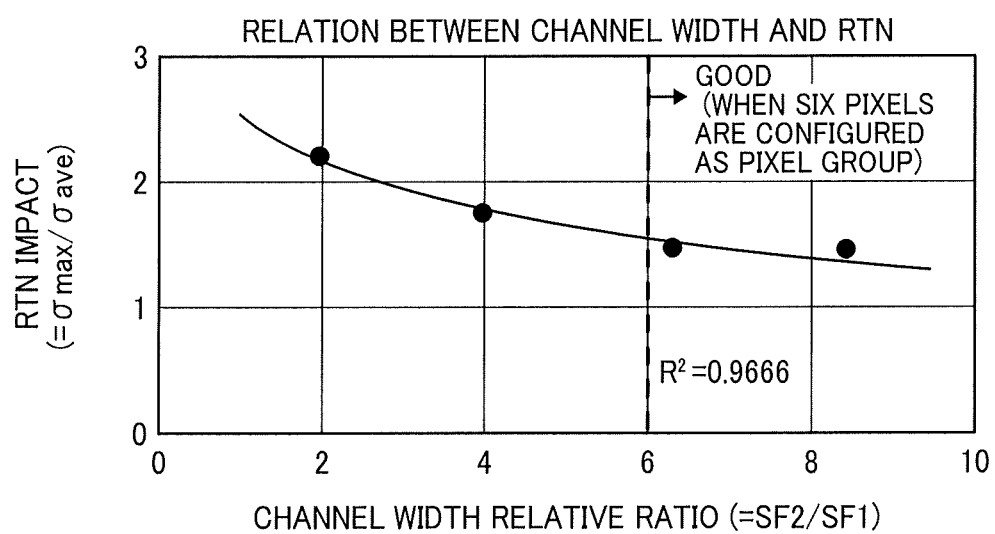
FIG. 17 is a diagram for explaining a relation of an optimal channel width between the SF2 and the SF1, according to the third of the first embodiment.

FIG. 17 is a diagram for explaining a relation of an optimal channel width between the SF2 and the SF1. FIG. 17 illustrates a relation between the optimum ratio of the channel width of the SF2 to the channel width of the SF1 and the RTN impact on an entire image, with six pixels being a column ADC configuration illustrated in FIG. 2 as an example. With regard to the RTN impact, a relation in a case where a maximum noise ($\sigma$ max) with respect to an average noise ($\sigma$ ave) of all pixels is defined is illustrated.

As illustrated in FIG. 17, when the channel width (effective channel width) of the SF2 having a large contribution degree of the RTN with respect to the channel width (effective channel width) of the SF1 is increased, a value of SF2/SF1 increases and the RTN impact becomes small. Here, the RTN impact illustrated in FIG. 17 and a measure of ease of visibility on an image are in a following relation.

The RTN impact of 2 or more is a clearly visible level (see, for example, FIG. 15A). The RTN impact 1.7 to 2 is a visually recognizable level depending on conditions. The RTN impact less than 1.7 is an invisible level (level without problems) (see, for example, FIG. 15B). Therefore, it can be said that it is desirable that the RTN impact is less than 1.7.

In FIG. 17, when the ratio of the channel width (effective channel width) of the SF2 to the channel width (effective channel width) of the SF1 is 6 or more, that is, the channel width (effective channel width) of the SF2 is configured to have k=6 or more, which is a number of pixels of a column configuration, than the channel width (effective channel width) of the SF1, the RTN impact is approximately 1.5 which is less than 1.7. In addition, if the ratio is further increased from there, the reduction effect on the RTN impact also saturates accordingly, and thus a further increase in the ratio results in affecting more in size-up than the reduction of the RTN impact.

Therefore, the optimum ratio of the channel widths of the SF1 and the SF2 is preferably not less than the number of pixels k (in this example, "6") of a column configuration in terms of the RTN impact, and preferably a value close to the number of pixels of the column configuration in terms of a circuit size.

(Example 4)

In the foregoing embodiments and each example, a configuration in which the effective channel width is enlarged by increasing the transistor size and by physically enlarging the channel width has been described. However, due to a constraint on a circuit space, there are cases where the channel width may not be necessarily enlarged depending on a configuration.

Therefore, in this fourth example, a configuration is illustrated in which the effective channel width is equivalently enlarged by setting a current (bias current) of a transistor greatly affected by the RTN to be larger than a current of a transistor less affected by the RTN. This makes it possible to enlarge the effective channel width even when there is a constraint on a circuit scale.

Figure 18A:
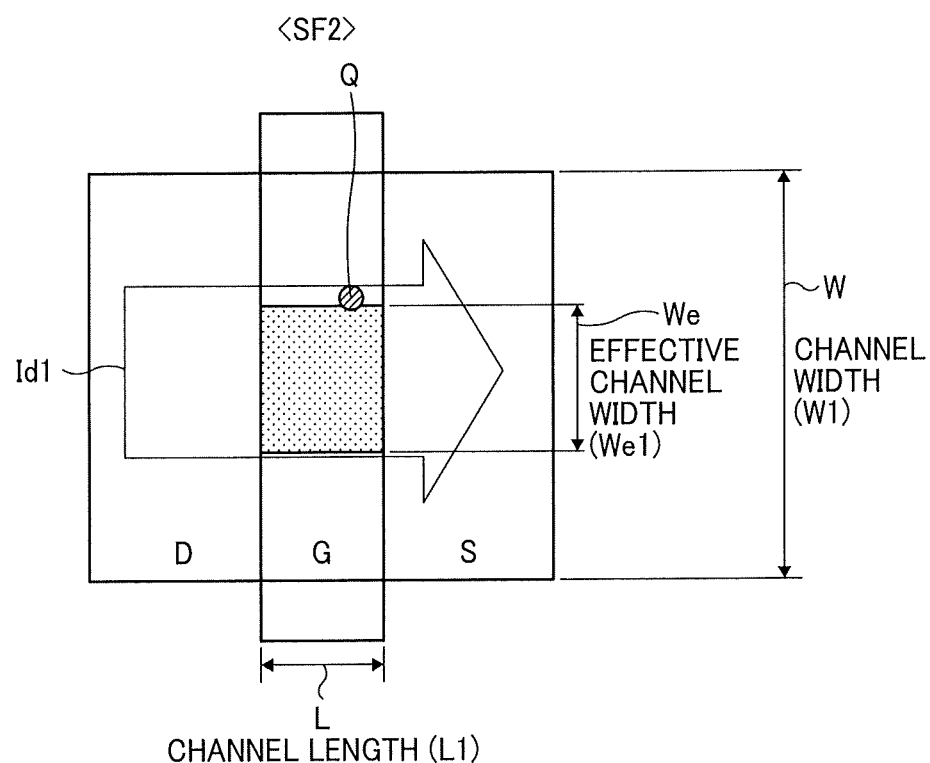
FIGS. 18A and 18B are diagrams illustrating an example of a configuration for equivalently enlarging the effective channel width by an amount of current, according to the fourth example of the first embodiment.
Figure 18B:
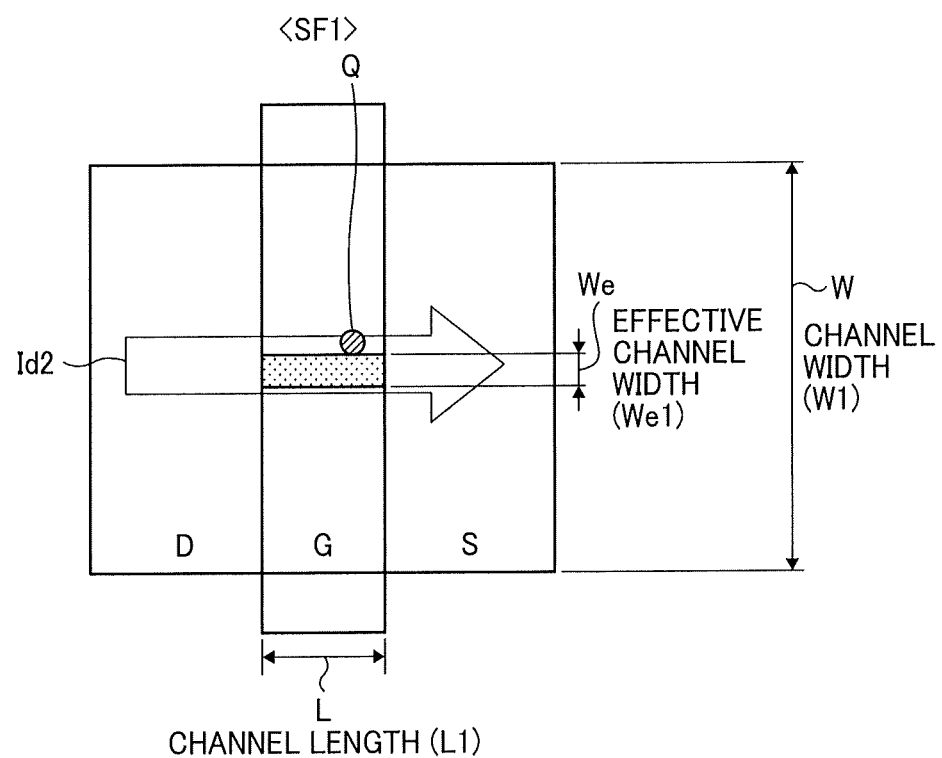

FIGS. 18A and 18B are diagrams illustrating an example of a configuration for equivalently enlarging the effective channel width by an amount of current. In FIGS. 18A and 18B, a basic configuration is the same as the configuration of FIGS. 14A and 18B, and FIG. 18A is the SF2, and FIG. 18B is the SF1. A difference from FIGS. 14A and 18B is that sizes of the transistors are the same in FIG. 18A and FIG. 18B, and that the bias (drain) current Id1 of the SF2 is made larger than the drain current Id2 of the SF1.

Let us consider a case where, supposedly, there is a crystal defect Q on a path through which a current flows in FIG. 18B. At this time, considering that a position at which the current Id2 flows is physically almost fixed, it can be considered that an effective current path is in a state of being blocked by the crystal defect Q. That is, the effective channel width is in a limited state, which is easily affected by the crystal defect Q.

Meanwhile, in FIG. 18A, since the current Id1 is larger than the current Id2, a path through which the current Id1 flows is enlarged. Therefore, the effective current path is not limited by the crystal defect Q as described above, and the effective channel width is in a state where the effective channel width is equivalently enlarged more relatively than the current Id2. For this reason, an impact of the crystal defect Q is relatively more difficult to receive in the current Id1 than in the current Id2.

The above may be understood by an amount of current. For example, when the current Id1=2 μA and the current Id2=1 μA, since the current is defined by a charge transfer amount per unit time, the amount of charge moved by the current Id2 is twice the amount of charge moved by the current Id1. If the charge (electrons) trapped in the crystal defect Q is a fixed number, the amount of charge trapped with respect to the amount of charge by a true signal is relatively smaller in the current Id1 than in the current Id2. Therefore, it can be understood that the impact of the crystal defect Q is relatively more difficult to receive in the current Id1 than in the current Id2.

In FIGS. 18A and 18B, while the effective channel width has been described with the use of a model of a path through which a current actually flows, the effective channel width by a channel width enlargement described so far is a path through which a current can flow.

In addition, in the fourth example, a configuration in which transistors are configured to have the same size has been illustrated as an example of equivalently enlarging the effective channel width, but the size of the transistors is not limited thereto.

The present inventor(s) have also found an optimum ratio of the bias current between the SF1 (transistor for every pixel) and the SF2 (transistor for every pixel group).

Figure 19:
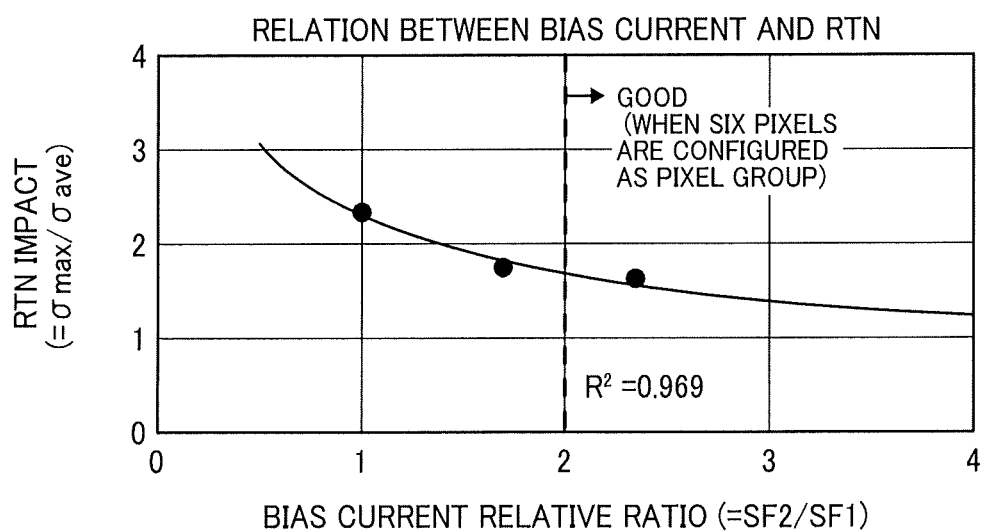
FIG. 19 is a diagram illustrating an optimal bias current ratio of the SF2/SF1, with six pixels being a column ADC configuration, according to a fourth example of the first embodiment.

FIG. 19 is a diagram illustrating an optimal bias current ratio of the SF2/SF1, with six pixels being a column ADC configuration as an example. FIG. 19 illustrates a relation between an optimum ratio of the bias current amount of the SF2 to the bias current amount of the SF1 and the RTN impact in an entire image. With regard to the RTN impact, similarly to FIG. 17, a relation in a case where the maximum noise (σ max) with respect to the average noise (σ ave) of all pixels is defined is illustrated.

As illustrated in FIG. 19, when the bias current amount of the SF2 having a large contribution degree of the RTN with respect to the channel width (effective channel width) of the SF1 is increased, a value of the SF2/SF1 increases and the RTN impact becomes small. In particular, it is understood that when the ratio of the SF2 to the SF1 is 2 or more, that is, the bias current of the SF2 is twice or more than the bias current of the SF1, the RTN impact is approximately 1.7. In addition, as the ratio is further increased from there, the reduction effect on the RTN impact also saturates, and thus a further increase in the ratio results in affecting more in power consumption and heat generation than the RTN impact.

Therefore, the optimum ratio of the bias currents of the SF1 and the SF2 is preferably 2 or more in terms of the RTN impact, and preferably closer to 2 in terms of power consumption and heat generation.

(Example 5)

Heretofore, an example has been illustrated in which the effective channel width is equivalently enlarged by physically increasing the channel width by increasing the size of the transistor or by increasing the bias current of the transistor. However, there are cases where any method cannot be employed due to constraints on a circuit space and a circuit design.

Therefore, in this fifth example, a formation position of a channel of a transistor which is greatly affected by the RTN is deepened. The channel formed away from an Si surface is called a buried channel. The buried channel can be easily formed by changing formation conditions of implantation (acceleration) energy, ion species, implantation amount, and the like in implanting ions (impurity) in a miniaturization processing process of the MOS transistor. The formation of the buried channel makes it possible to enlarge the effective channel width even when there are constraints on a circuit space and a circuit design.

Figure 20A:
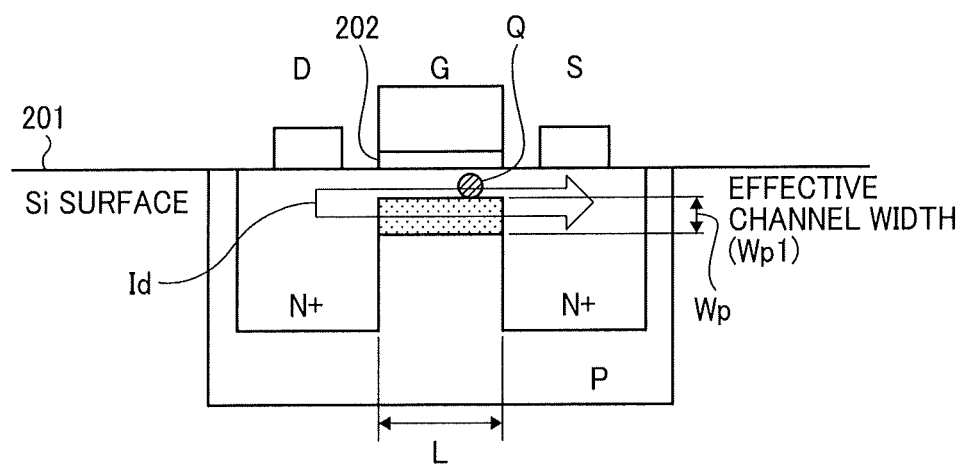
FIGS. 20A and 20B are diagrams illustrating an example of a configuration in which the effective channel width is enlarged by forming a buried channel, according to a fifth example of the first embodiment.
Figure 20B:
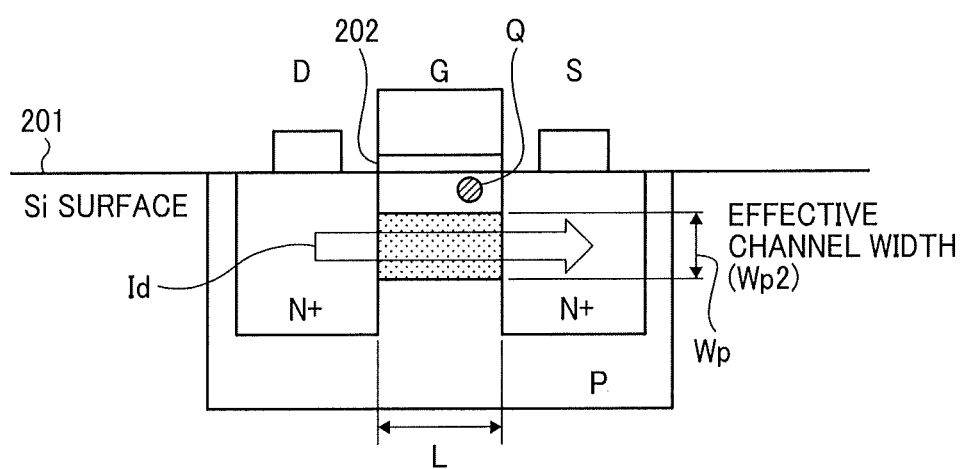

FIGS. 20A and 20B are diagrams illustrating an example of a configuration in which the effective channel width is enlarged by forming the buried channel. FIG. 20A and FIG. 20B illustrate cross-sectional views in a depth direction of the transistor. In this fifth example, a width in a depth direction orthogonal to a channel length L is called a channel width, and an effective channel width Wp of the channel width is enlarged.

It is generally known that there are many crystal defects on a surface of a silicon (Si) wafer. At this time, as illustrated in FIG. 20A, if the channel is formed at a position close to the Si surface (an area having a shallow depth), the surface is likely to be affected by the crystal defect Q, and the effective channel width Wp is limited more than an original channel width. On the other hand, as illustrated in FIG. 20B, when the channel is formed at a position apart from the Si surface (an area having a relatively deep depth), that is, the buried channel is formed, the surface is hardly affected by the crystal defect Q. Therefore, the effective channel width Wp can be made equal to the original channel width, and the effective channel width Wp can be enlarged relatively.

As described above, in the first embodiment or each example, by relatively increasing the effective channel width of the transistor having a large contribution degree of the RTN, with respect to the effective channel width of other transistors, the RTN impact is reliably reduced and image quality is improved.

The first embodiment and each modification may be individually applied, or two or more of those may be arbitrarily combined and applied.

If priority is given to making the effective channel width of a first element larger than the effective channel width of a second element in a circuit configured for every pixel, the RTN impact on every pixel can be effectively reduced.

If priority is given to making the effective channel width of the first element to be larger than the effective channel width of the second element in the circuit configured for every pixel group, the RTN impact on every pixel group can be effectively reduced.

If the effective channel width of the first element of the circuit configured for every pixel group is made larger than the effective channel width of the second element of the circuit configured for every pixel, the RTN impact on an entire image can be effectively reduced.

If the channel width is effectively increased by combining a plurality of transistor elements, the effective channel width can be increased while minimizing the variation among the transistors.

If ratios between each channel length and each channel width of the first element and the second element are equalized, the effective channel width can be increased while matching the characteristics of the transistors.

If the bias current of the first element is made larger than the bias current of the second element, the effective channel width can be relatively increased without changing the circuit scale.

If the depth of the buried channel is deepened, the effective channel width can be increased even when the current and size are limited.

If the channel width of the first element is made k times the channel width of the second element or the bias current of the first element is made twice the bias current of the second element, the RTN impact can be reduced with a minimum configuration.

In the first embodiment and each modified example thereof, the CMOS linear image sensor has been described as an example. The CMOS linear image sensor is the same as a Charge Coupled Device (CCD) in that incident light is photoelectrically converted by a photodiode, but differs from the CCD in that the incident light is charge-voltage converted in the vicinity of a pixel and output to a subsequent stage.

In addition, the CMOS sensor can use a CMOS process and thus can incorporate a high-speed logic circuit such as an ADC, and considered to be more advantageous than the CCD in terms of high speed. In the above example, as a method for increasing a speed of the CMOS linear image sensor, a column ADC type for performing AD-conversion or the like for every pixel group having a plurality of pixels as a unit is employed, and a configuration in which an amplification transistor is included for every pixel group at a preceding stage of the ADC, thereby buffering pixel signals in the pixel group and sequentially outputting same to the ADC has been illustrated.

The configurations described above are an example, and the photoelectric conversion element is not limited to those configurations.

The photoelectric conversion element according to any one of the embodiments may be incorporated in, for example, an image processing apparatus such as a scanner or a muiltifunctional peripheral (MFP), as described below.

Second Embodiment

An application example to a scanner (an example of "image reading device") including an image reading means including a photoelectric conversion element illustrated as an example in the first embodiment or each modified example thereof will be illustrated. The first embodiment and each modified example thereof may be individually applied to, or two or more of those may be arbitrarily combined and applied to the photoelectric conversion element.

Figure 21A:
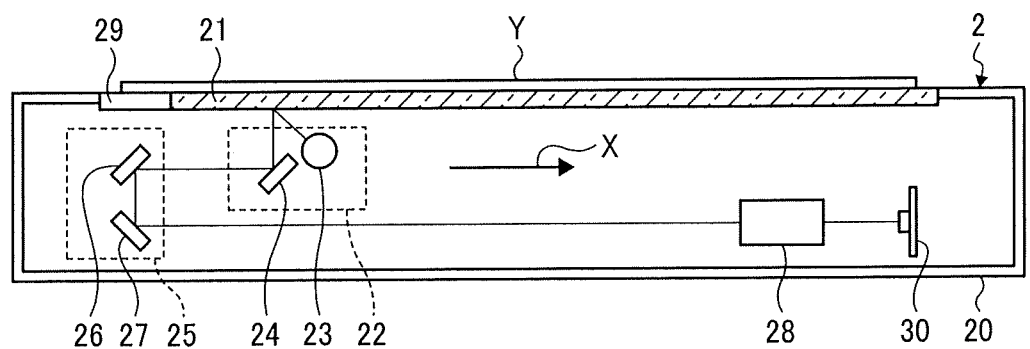
FIGS. 21A and 21B are diagrams illustrating an example of a configuration of a scanner illustrated as an image reading device according to a second embodiment.
Figure 21B:
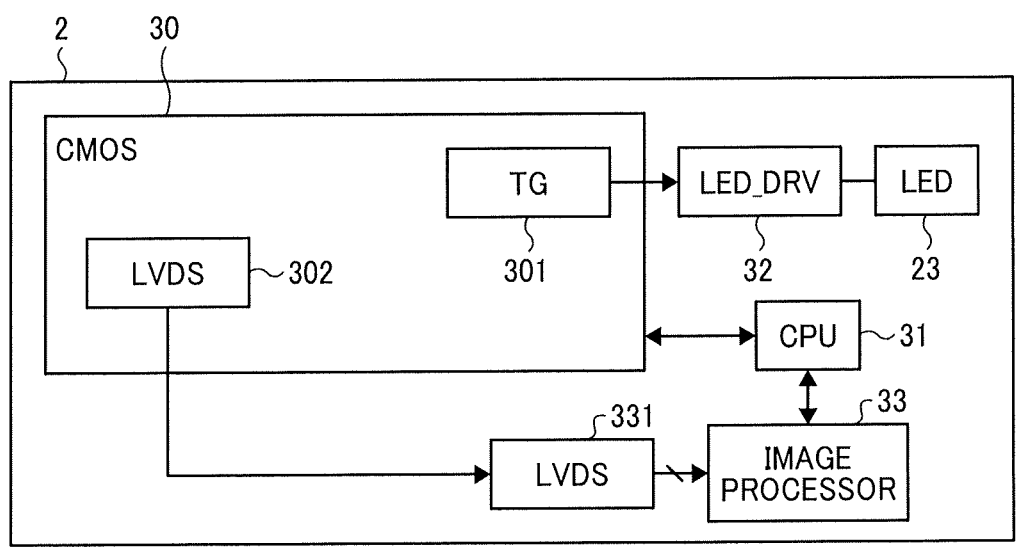

FIGS. 21A and 21B are diagrams illustrating an example of a configuration of a scanner illustrated as an image reading device according to the second embodiment. First, with reference to FIG. 21A, an overall configuration of the scanner will be described.

The scanner 2 in FIGS. 21A and 21B include a contact glass 21 on an upper surface of a housing 20, and includes, inside the housing 20, a first carriage 22, a Light Emitting Diode (LED) 23, a first reflective mirror 24, a second carriage 25, a second reflective mirror 26, a third reflective mirror 27, a lens unit 28, a reference white board 29, and a CMOS linear image sensor 30.

The first carriage 22 includes the LED 23 and the first reflective mirror 24, and moves in a sub-scanning direction X. The second carriage 25 includes the second reflective mirror 26 and the third reflective mirror 27, and moves in a predetermined direction.

The LED 23 is a light source of the scanner 2 and illuminates a manuscript Y placed on the contact glass 21 and the reference white board 29. Reflected light from the manuscript Y and the reference white board 29 is guided to the lens unit 28 via the first reflective mirror 24, the second reflective mirror 26, and the third reflective mirror 27.

The lens unit 28 is a micro-lens array or the like and images, the light from the third reflective mirror 27, in a light receiving area of each pixel of the CMOS linear image sensor 30.

The CMOS linear image sensor 30 is a CMOS linear image sensor illustrated as an example in the first embodiment or any of the modified examples thereof.

Next, control of the scanner 2 will be described with reference to a control block diagram of the scanner 2 in FIG. 21B.

The scanner 2 includes a Central Processing Unit (CPU) 31, the CMOS linear image sensor 30, an LED driver (LED_DRV) 32, the LED 23, an image processor 33, and the like. In addition to this, though not illustrated, a motor for moving the first carriage 22 and the second carriage 25, a motor driver thereof, and the like are also configured.

The CPU 31 controls an entire system of the scanner 2.

The CMOS linear image sensor 30 incorporates a timing generator (TG) 301 and performs an output operation of pixel signals of entire pixels and an AD-conversion operation in an ADC column configuration unit by a control signal generated by the TG 301.

The LED_DRV 32 controls turning on/off of the LED 23 on the basis of the control signal of the TG 301.

The scanner 2 photoelectrically converts, reflected light from the manuscript Y illuminated by the LED 23, for every pixel in the CMOS linear image sensor 30, and performs post-stage processing such as A/D conversion of each pixel signal in a pixel group unit. Image data obtained by the post-stage processing is input from an LVDS (transmitter) 302 to an LVDS (receiver) 331, is subjected to various image corrections and processings in the image processor 33 which is a main board of image processing, and is stored in a predetermined storage area.

The image reading device according to the second embodiment includes the photoelectric conversion element according to the first embodiment or any one of the modified examples described above. Therefore, the image reading device is able to read images with high image quality, in which the RTN impact is reduced.

Third Embodiment

An image forming device including the photoelectric conversion element illustrated as an example in the first embodiment or each modified example thereof will be illustrated as a third embodiment. The first embodiment and each modified example thereof may be individually applied to, or two or more of those may be arbitrarily combined and applied to the photoelectric conversion element. Here, an example of application to a multifunction peripheral including a scanner (image reading means) will be described.

Figure 22:
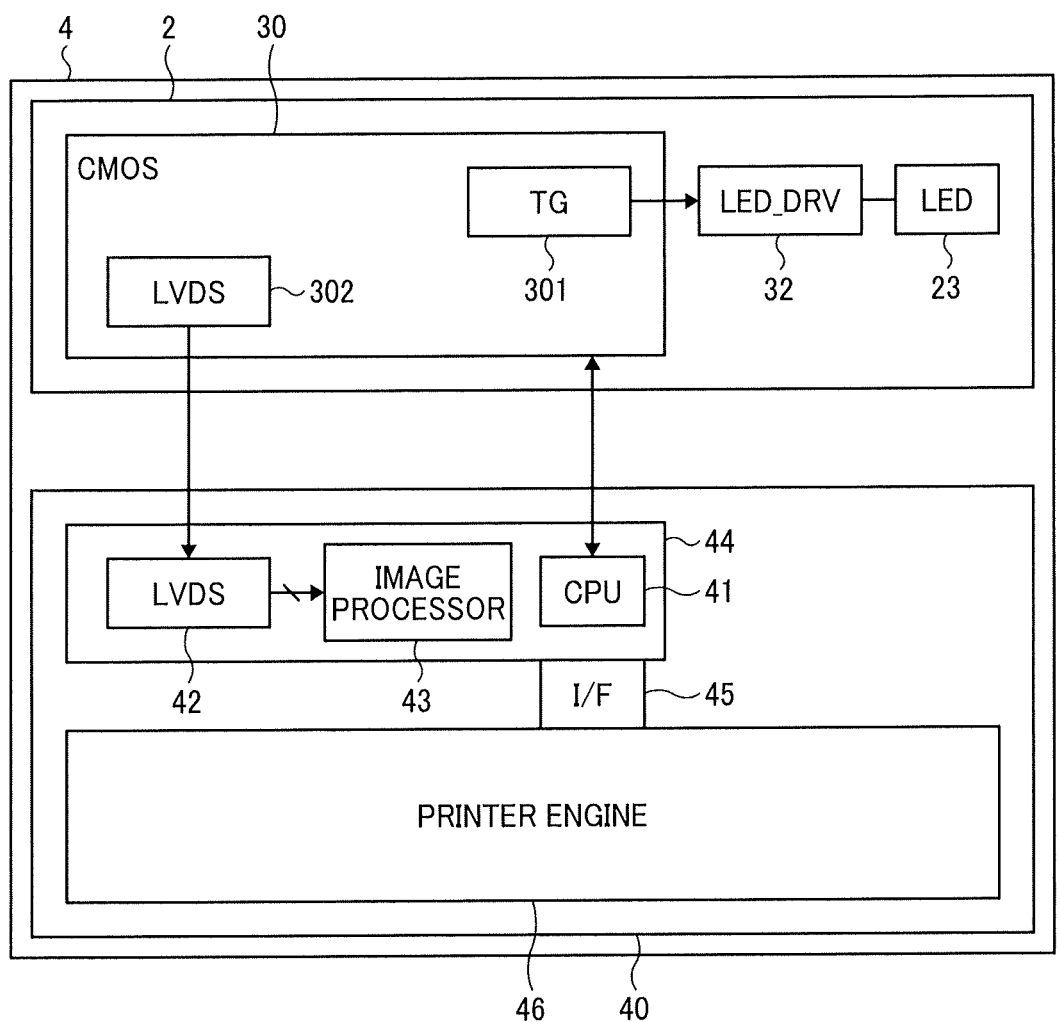
FIG. 22 is a diagram illustrating an example of a configuration of a multifunction peripheral illustrated as an image forming device according to a third embodiment.

FIG. 22 is a diagram illustrating an example of a configuration of a multifunction peripheral illustrated as an image forming device according to the third embodiment. A multifunction peripheral 4 illustrated in FIG. 22 includes a scanner 2 which is an example of an "image reading means" and a printer 40 which is an example of an "image forming means". The multifunction peripheral 4 includes a main board 44 including a CPU 41, an LVDS (receiver) 42, and an image processor 43 on a printer 40 side. The main board 44 is coupled to a printer engine 46 via an interface (I/F) 45.

The CPU 41 comprehensively controls an entire system including the printer engine 46 and the scanner 2. The printer engine 46 forms an image on a recording medium (for example, a recording paper or the like). For example, the printer engine 46 forms the image on the recording medium by an inkjet method or an electrophotography method.

In the multifunction peripheral 4, the scanner 2 photoelectrically converts, reflected light from the manuscript Y illuminated by the LED 23, for every pixel in the CMOS linear image sensor 30, and performs post-stage processing such as A/D conversion of each pixel signal in a pixel group unit. Image data obtained by the post-stage processing is output from the LVDS (transmitter) 302 to the LVDS (receiver) 42 of the printer 40.

In the printer 40, clock/sync signal/image data output from the LVDS (transmitter) 302 of the scanner 2 is input to the LVDS (receiver) 42 and converted to clock/line sync signal/parallel 10 bit data by the LVDS (receiver) 42. The converted data is subjected to various image corrections and processings in the image processor 43, and is output to the printer engine 46, and thus an image is formed on the recording medium.

The image forming device according to the third embodiment includes the image reading device including the photoelectric conversion element according to the first embodiment or each modified example thereof. Thus, image reading with high image quality, in which the RTN impact is reduced, is performed in the image reading device, and image forming with high image quality can be provided as the whole image forming device.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

The invention claimed is:

1. A photoelectric conversion element comprising:
a plurality of pixels configured to receive light; and
a signal processor configured to process a signal of the pixels, the signal processor including:
a first transistor having a first effective channel width through which a current can effectively pass through in the first transistor; and
a second transistor having a second effective channel width through which a current can effectively pass through in the second transistor,
wherein the first effective channel width of the first transistor is larger than the second effective channel width of the second transistor.

2. The photoelectric conversion element according to claim 1,
wherein the signal processor is a pixel circuit configured to output the signal of the pixels to a subsequent stage for each pixel, and the first transistor and the second transistor are both disposed in the pixel circuit,
the first transistor is an amplification transistor of a source follower configured to amplify the signal of the pixels and output the signal to the subsequent stage, and
the second transistor is any of switching transistors of the pixel circuit used for any element of the pixel circuit other than the source follower.

3. The photoelectric conversion element according to claim 2,
wherein the amplification transistor is provided for a current source of the source follower, and
the second transistor is any of switching transistors of the pixel circuit used for any element of the pixel circuit other than the current source of the source follower.

4. The photoelectric conversion element according to claim 2, wherein the signal processor further includes a pixel group circuit configured to process an output signal of the pixel circuit for each pixel group and output the output signal to the subsequent stage.

5. The photoelectric conversion element according to claim 1,
wherein the signal processor includes a pixel circuit configured to output the signal of the pixels to a pixel group circuit, and the pixel group circuit configured to process an output signal of the pixel circuit for each pixel group and output the output signal to a subsequent stage, the first transistor is disposed in the pixel group circuit and the second transistor is disposed in the pixel circuit,
the first transistor is an amplification transistor of a source follower configured to amplify the output signal of the pixel circuit and output the output signal to the subsequent stage, and
the second transistor is an amplification transistor of a source follower configured to amplify the signal of the pixels and output the signal to the pixel group circuit.

6. An image processing apparatus comprising:
an image reading device configured to read image data, the image reading device including the photoelectric conversion element according to claim 1.

7. The image processing apparatus of claim 6, further comprising:
an image forming device configured to form an image based on image data read by the image reading device.

8. The photoelectric conversion element according to claim 1, wherein the photoelectric conversion element is a complementary metal oxide semiconductor (CMOS) photoelectric conversion element.

9. The photoelectric conversion element according to claim 1, wherein the photoelectric conversion element is a linear image sensor in which the pixels are one-dimensionally configured for every color.

10. The photoelectric conversion element according to claim 9, wherein an input of the first transistor is in a high impedance state.

11. The photoelectric conversion element according to claim 9, wherein the first channel width of the first transistor is increased with respect to the second channel width of the second transistor.

12. The photoelectric conversion element according to claim 11, wherein the first channel width of the first transistor is k times or more the second channel width of the second transistor, k being a number of pixels processed by one pixel group circuit.

13. The photoelectric conversion element according to claim 9, wherein a plurality of transistor elements are combined to increase the first channel width of the first transistor.

14. The photoelectric conversion element according to claim 9, wherein ratios of a channel length and the channel width between the first transistor and the second transistor are same.

15. The photoelectric conversion element according to claim 9, wherein a channel of the first transistor is buried more deeply than a channel of the second transistor as a buried channel.

16. The photoelectric conversion element according to claim 9, wherein a bias current amount of the first transistor is increased with respect to a bias current amount of the second transistor.

17. The photoelectric conversion element according to claim 16, wherein a bias current of the first transistor is twice or more a bias current of the second transistor.

* * * * *